US008952364B2

(12) United States Patent
Lai et al.

(10) Patent No.: US 8,952,364 B2
(45) Date of Patent: Feb. 10, 2015

(54) LIGHT-EMITTING DEVICES COMPRISING NANOSTRUCTURES

(71) Applicant: Nitto Denko Corporation, Osaka (JP)

(72) Inventors: Qianxi Lai, Vista, CA (US); Shijun Zheng, San Diego, CA (US); David T. Sisk, San Diego, CA (US); Amane Mochizuki, Carlsbad, CA (US)

(73) Assignee: Nitto Denko Corporation, Osaka (JP)

( * ) Notice: Subject to any disclaimer, the term of this patent is extended or adjusted under 35 U.S.C. 154(b) by 14 days.

(21) Appl. No.: 13/672,394

(22) Filed: Nov. 8, 2012

(65) Prior Publication Data

US 2013/0140534 A1   Jun. 6, 2013

Related U.S. Application Data

(60) Provisional application No. 61/696,084, filed on Aug. 31, 2012, provisional application No. 61/558,217, filed on Nov. 10, 2011.

(51) Int. Cl.
*H01L 51/30* (2006.01)
*H01L 51/52* (2006.01)
*H01L 51/00* (2006.01)

(52) U.S. Cl.
CPC ........ *H01L 51/5262* (2013.01); *H01L 51/5268* (2013.01); *H01L 51/0069* (2013.01); *H01L 51/007* (2013.01); *H01L 2251/5369* (2013.01)
USPC .......... 257/40; 257/86; 257/87; 257/E51.018; 257/E51.028; 257/E51.029

(58) Field of Classification Search
USPC ............... 257/40, 86, 87, E51.018, E51.028, 257/E51.029
See application file for complete search history.

(56) References Cited

U.S. PATENT DOCUMENTS

| | | | |
|---|---|---|---|
| 6,354,709 B1 | 3/2002 | Campbell et al. | |
| 6,594,079 B1 | 7/2003 | Trott et al. | |
| 6,707,611 B2 | 3/2004 | Gardiner et al. | |
| 7,799,416 B1 | 9/2010 | Chan et al. | |
| 7,864,450 B2 | 1/2011 | Segawa et al. | |
| 7,957,621 B2 | 6/2011 | Zhang | |
| 7,982,396 B2 | 7/2011 | Cok | |
| 2007/0114523 A1 | 5/2007 | Oumi et al. | |
| 2008/0272367 A1* | 11/2008 | Cok ................................. 257/40 |
| 2009/0102359 A1 | 4/2009 | Miyata et al. | |
| 2010/0059778 A1 | 3/2010 | Shimizu et al. | |
| 2010/0060154 A1 | 3/2010 | Nomura et al. | |

(Continued)

FOREIGN PATENT DOCUMENTS

WO   2010/095514 A1   8/2010

OTHER PUBLICATIONS

Canzler et al., 66.2: Efficiency enhancement in white PIN OLEDs by simple internal outcoupling methods. Novaled AG, Dresden, Germany, SID 11 Digest, pp. 975-978 (2011).

(Continued)

*Primary Examiner* — Victor A Mandala
(74) *Attorney, Agent, or Firm* — K&L Gates LLP; Louis C. Cullman; Brent A. Johnson

(57) ABSTRACT

Light-emitting devices are described herein.

20 Claims, 19 Drawing Sheets

(56) References Cited

U.S. PATENT DOCUMENTS

| | | | |
|---|---|---|---|
| 2010/0320447 A1* | 12/2010 | Chen et al. ............... | 257/40 |
| 2010/0326526 A1 | 12/2010 | Zheng et al. | |
| 2011/0140093 A1 | 6/2011 | Zheng et al. | |
| 2011/0168976 A1* | 7/2011 | Mao ............... | 257/13 |
| 2011/0181179 A1 | 7/2011 | Birnstock | |
| 2011/0248256 A1* | 10/2011 | Cok et al. ............. | 257/40 |
| 2011/0266577 A1* | 11/2011 | Kim et al. ............. | 257/98 |
| 2012/0179089 A1 | 7/2012 | Sisk et al. | |
| 2012/0226046 A1 | 9/2012 | Zheng et al. | |
| 2012/0326192 A1* | 12/2012 | Van Slyke et al. .......... | 257/98 |
| 2013/0240847 A1* | 9/2013 | Zakhidov et al. ........... | 257/40 |
| 2014/0042422 A1* | 2/2014 | Silverman et al. .......... | 257/40 |

OTHER PUBLICATIONS

Nakamura et al., 40.4: Glass substrates for OLED lighting with high out-coupling efficincy. Asahi Glass Co., Ltd., Yokohama, Japan, SID 09 Digest, pp. 603-606 (2009).

Reineke et al., White organic light-emitting diodes with fluroscent tube efficiency. Nature, vol. 459, pp. 234-238 (2009).

Tyan et al., 60.1: Invited paper: tandem hybrid white OLED devices with improved light extraction. Eastman Kodak Company, Rochester, New York, SID 09 Digest, pp. 895-898 (2009).

G. Gustafsson, et al., "Flexible light-emitting diodes made from soluble conducting polymers," Nature, vol. 357, No. 6378, pp. 477-479, 1992.

* cited by examiner

LIGHT-EMITTING DEVICES COMPRISING NANOSTRUCTURES

CROSS-REFERENCE TO RELATED APPLICATIONS

This application claims the benefit of U.S. Provisional Application No. 61/696,084, filed Aug. 31, 2012 and U.S. Provisional Application No. 61/558,217, both of which are incorporated by reference in their entirety herein.

BACKGROUND

Organic light-emitting devices (OLED) are becoming increasingly important in lighting and display applications. However, there may still be significant improvements yet to be made for OLED technology in order to encourage widespread use. For example, total internal reflection currently limits the amount of light extracted from a device to about 20-35% of the light emitted by OLED. While external scattering films or micro-lens arrays (MLA) may help to extract some of the emitted light, other approaches are still needed to further improve device efficiency.

SUMMARY

Incorporation of nanostructure material into organic layers of an OLED device may help to improve light extraction from organic modes of a device.

Some embodiments include a light-emitting device comprising: a light-emitting layer disposed between an anode and a cathode; a first charge-transport layer comprising a first charge-transport material, and disposed between the light-emitting layer and the anode or the cathode; and a nanostructure material disposed between, or in contact with, the first charge-transport layer and the light-emitting layer. In some embodiments, substantially all light emitted from the device may pass through the first-charge transport layer.

These and other embodiments are described in more detail herein.

DETAILED DESCRIPTION

Figure 1A:
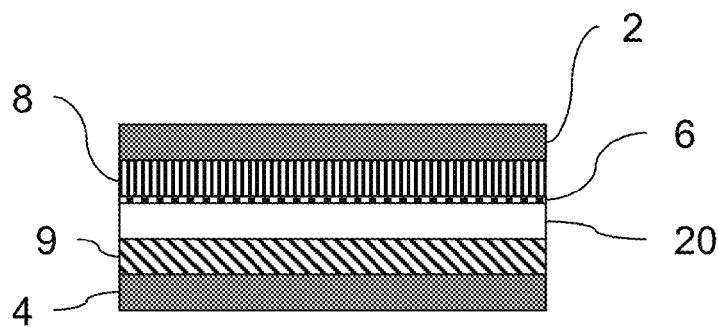
FIG. 1A is a schematic depiction of an embodiment of an organic light-emitting device.

FIG. 1 is a schematic representation of the structure of some embodiments of devices described herein. A light-emitting layer 20 is disposed between a first electrode 2 and a second electrode 4. A nanostructure material 6 is disposed on light-emitting layer 20, and a first charge-transport layer 8 is disposed between the nanostructure material 6 and first electrode 2. An optional second charge-transport layer 9 may be disposed between second electrode 4 and light-emitting layer 20. Other layers, such as charge injection layers (e.g. electron injection layers or hole injection layers), charge blocking layers (e.g. electron blocking layers or hole blocking layers), hole blocking layers, etc., may also be present in the device.

The character of the electrodes and the charge-transport layers may depend upon the particular device structure. For example, if first electrode 2 is an anode, first charge-transport layer 8 is a hole-transport layer, second electrode 4 is a cathode, and second charge-transport layer 9, if present, is an electron-transport layer. Conversely, if first electrode 2 is a cathode, first charge-transport layer 8 is an electron-transport layer, second electrode 4 is an anode, and second charge-transport layer 9, if present, is a hole-transport layer. Thus, a hole-transport layer, if present, may be disposed between a light-emitting layer and an anode, and an electron-transport layer, if present, may be disposed between a light-emitting layer and a cathode.

In addition, the direction of light may depend upon the particular device structure, e.g., top emitting or bottom emitting. In some embodiments, a nanostructure material may be in the path of light emitted from the device. In some embodiments, a nanostructure material may not be in the path of the light emitted from the device. In some embodiments, light can be emitted from the direction of light-emitting layer 20 through the nanostructure material 6, the first charge-transport layer 8, and the first electrode 2. In some embodiments, the path of light emitted by the device may go in the direction away from the nanostructure material 6.

Nanostructure material includes any material that can form nanostructures regardless of whether nanostructures are present. Nanostructure material, e.g. nanostructure material 6, may be in the form of: a plurality of nanostructures disposed on a surface of, between, or in contact with, the light-emitting layer and the first charge-transport layer; and/or in a transitional layer comprising a mixture of the first charge-transport material and the nanostructure material, and disposed between the light-emitting layer and the first charge-transport layer.

Figure 1B:
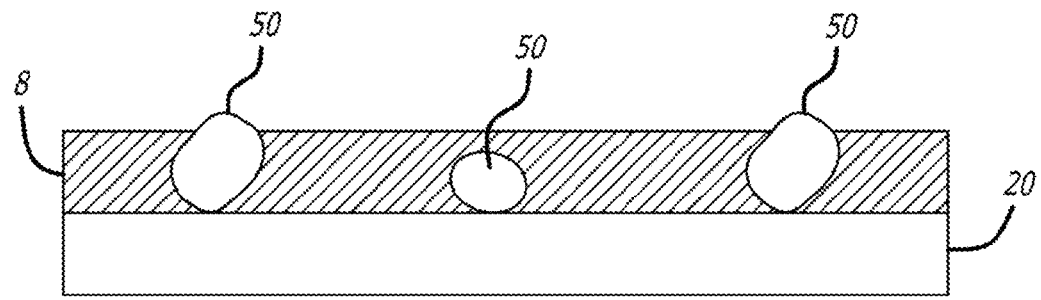
FIG. 1B is a schematic depiction of an example of how nanostructures may substantially penetrate a layer that the nanostructure contacts.
Figure 1C:
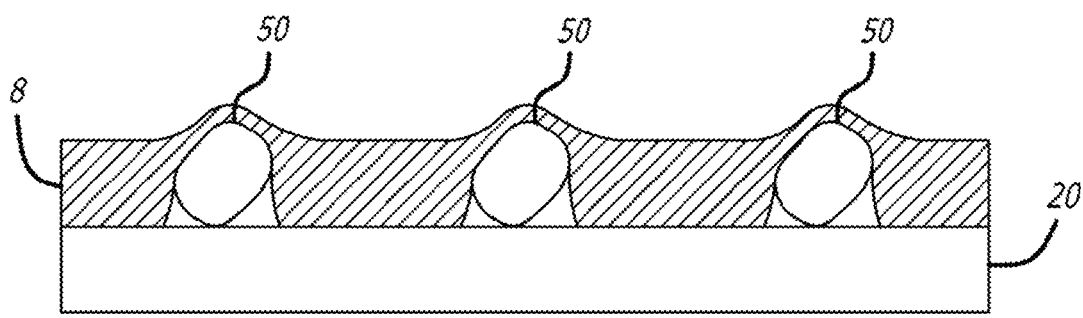
FIG. 1C is a schematic depiction of an example of how nanostructures may substantially deform a layer that the nanostructures contact.

In some of the figures depicted or described herein, a nanostructure material is depicted as a layer in a light emitting device. However, a nanostructure material may not be in the form of a layer in a traditional sense. For example a nanostructure, such as nanostructures 50, may substantially penetrate a layer that the nanostructure contacts, such as charge transport layer 8, as shown in FIG. 1B. A nanostructure, such as nanostructures 50, may also substantially deform a layer that the nanostructure contacts, such as charge transport layer 8, as shown in FIG. 1C. In some embodiments, a nanostructure may penetrate or deform a layer by at least about 5%, at least about 10%, at least about 30%, at least about 50%, at least about 90%, or at least about 100% of the thickness of the layer, or by at least about 1 nm, at least about 3 nm, at least about 5 nm, at least about 10 nm, or at least about 20 nm, wherein the direction of penetration is perpendicular to a plane substantially formed by the surface of a layer that contacts the nanostructure.

In some embodiments, a nanostructure may substantially penetrate or deform a light-emitting layer, an electron-transport layer, a hole-transport layer, a transitional layer, a hole-blocking layer, an electron-blocking layer, or an exciton-blocking layer. In some embodiments, a nanostructure may substantially penetrate or deform an electron-transport layer. In some embodiments, a nanostructure may substantially penetrate or deform a hole-transport layer. In some embodiments, a nanostructure may substantially penetrate or deform a light-emitting layer. In some embodiments, a nanostructure may substantially penetrate or deform a transitional layer.

Inclusion of nanostructure material may increase light output, luminous efficiency, or power efficiency of an OLED, as compared to a similar device without the nanostructure material (e.g. as illustrated in Tables 1-5), by about 2% to about 60%, about 5% to about 60%, about 10% to about 60%, about 10% to about 50%; about 2%, such as 2.22% or 2.28%; about 4%, such as 4.17%, 3.51%, or 4.08%; about 5%, such as 4.54%; about 6%, such as 5.88%; about 7%, such as 6.67%; about 8%, such as 7.84% or 7.94%; about 9%, such as 9.46% or 9.52%; about 10%, such as 9.68%; about 16%, such as 16.13%; about 18%, such as 18.31%; about 21%, such as 20.6%; about 22%, such as 22.65%; about 25%, such as 24.2%; about 28%, such as 28.2% or 27.5%; about 50%, such as 51.9% or 53.9%; about 60%, such as 60.6%, or any increase in a range bounded by, or between, any of these values.

Figure 2A:
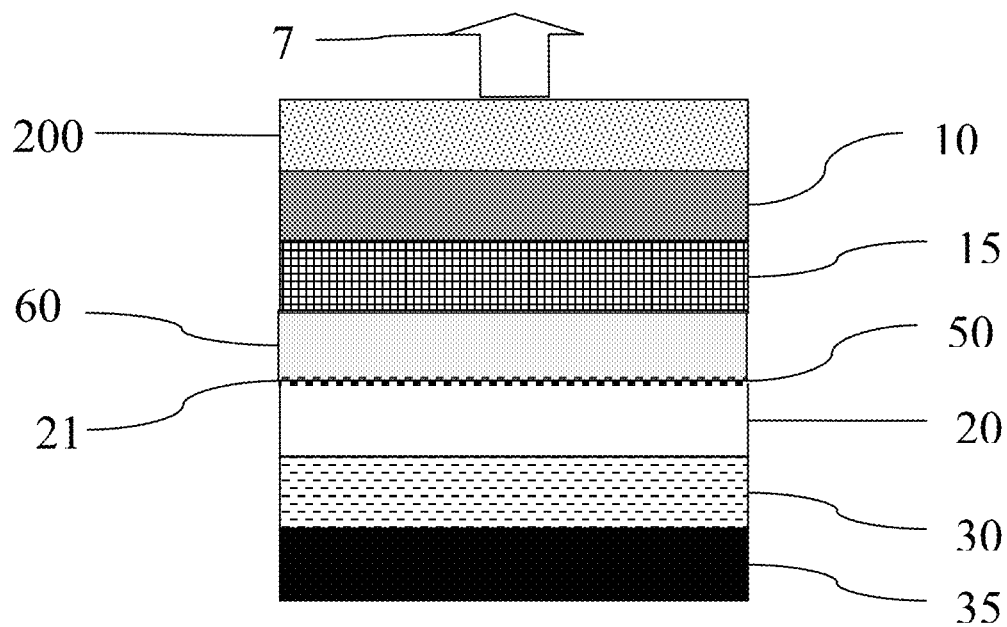
FIG. 2A is a schematic depiction of an embodiment of an organic light-emitting device.
Figure 2B:
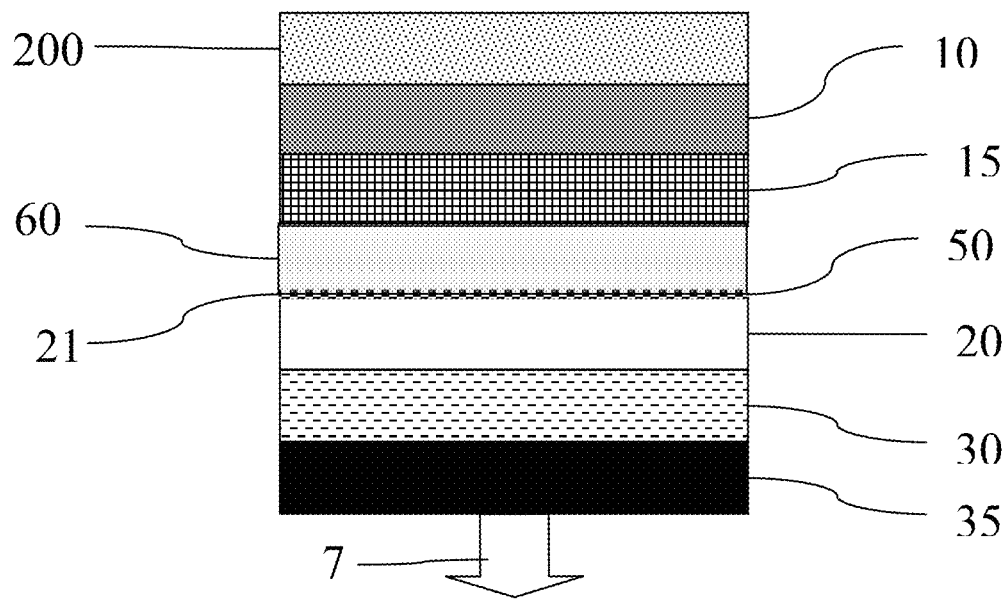
FIG. 2B is a schematic depiction of an embodiment of an organic light-emitting device.

Some embodiments may have a structure represented by FIGS. 2A and 2B. Light-emitting layer 20 is disposed between anode 10 and cathode 35. Optional plurality of nanostructures 50 may be disposed on a surface 21 of light-emitting layer 20. An optional transitional layer 60 may be disposed between surface 21 of light-emitting layer 20 and hole-transport layer 15. An optional electron-transport layer 30 may be disposed between light-emitting layer 20 and cathode 35. An optional light-extracting layer 200 may be disposed on anode 10. In some embodiments, the anode 10 may be disposed on a transparent substrate (not shown). Other layers may also be present.

In some embodiments, light 7 may be emitted from the direction of light-emitting layer 20 through the plurality of nanostructures 50 (if present), transitional layer 60 (if present), hole-transport layer 15, anode 10, and light-extracting material 200 (if present) (FIG. 2A). In some embodiments, light 7 may be emitted from the direction of the light-emitting layer 20 away from the plurality of nanostructures 50 (if present), through electron-transport of layer 30 (if present) and through cathode 35 (FIG. 2B).

Figure 3A:
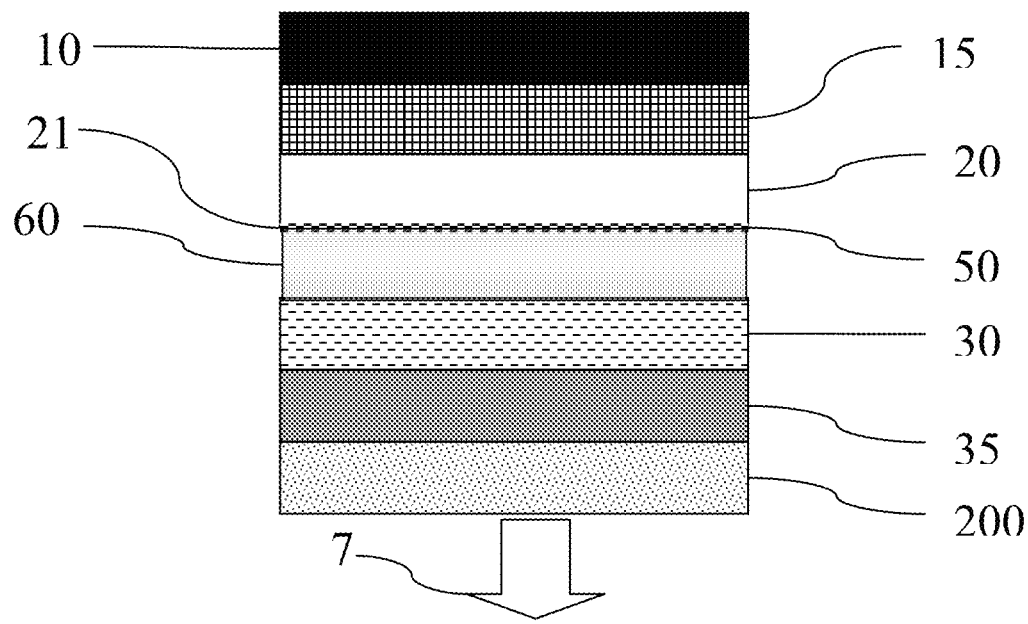
FIG. 3A is a schematic depiction of an embodiment of an organic light-emitting device.
Figure 3B:
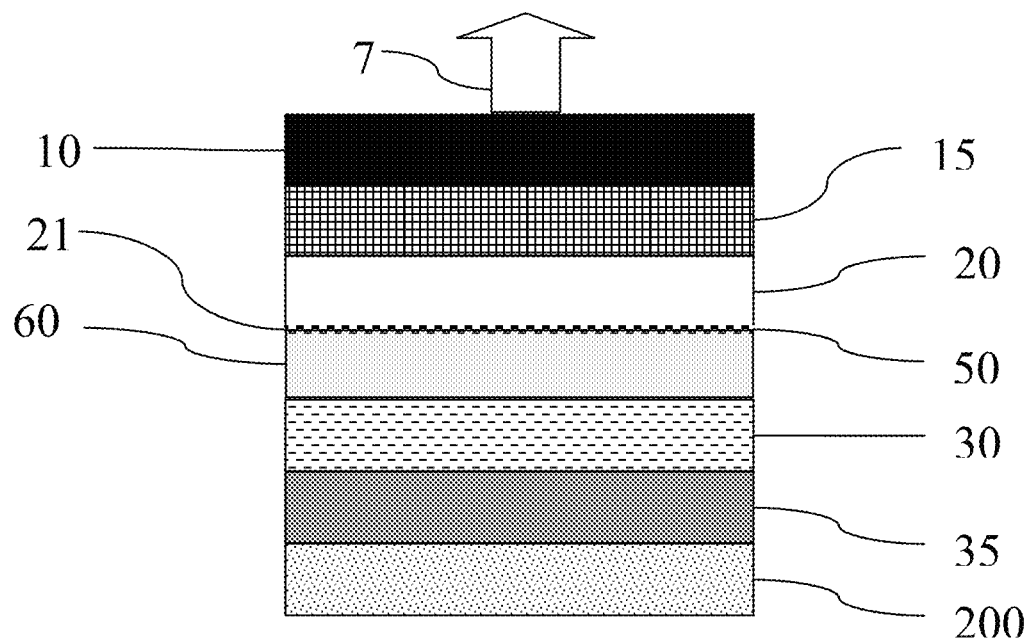
FIG. 3B is a schematic depiction of an embodiment of an organic light-emitting device.

Some embodiments may have a structure represented by FIGS. 3A-B. A light-emitting layer 20 is disposed between an anode 10 and a cathode 35. An electron-transport layer 30 is disposed between light-emitting layer 20 and cathode 35. An optional plurality of nanostructures 50 may be disposed on a surface 21 of light-emitting layer 20. An optional transitional layer 60 may be disposed between surface 21 of light-emitting layer 20 and electron-transport layer 30. An optional hole-transport layer 15 may be disposed between anode 10 and light-emitting layer 20. Cathode 35 may be disposed on optional light-extracting layer 200. Light 7 may be emitted from the direction of light-emitting layer 20 through the plurality of nanostructures 50 (if present), transitional layer 60 (if present), electron-transport layer 30, cathode 35, and light-extracting material 200 (if present) (FIG. 3A). Other layers may also be present. In some embodiments, light 7 may be emitted in the direction away from plurality of nanostructures 50 through hole-transport layer 15 (if present), and through anode 10 (FIG. 3B).

A nanostructure material, e.g. nanostructure material 6, or plurality of nanostructures, e.g. nanostructures 50, may substantially penetrate or deform, or may form a rough interface with the next layer, e.g. a transitional layer or a charge-transport layer. In some embodiments, the periodicity (separation) of the nanostructure material within or upon the deposed surface, e.g., the light-emitting layer, may vary. In some embodiments, nanostructures may have an irregular periodicity within in the matrix material. In some embodiments, the periodicity of the nanostructures in the interface or surface of the nanostructured layer is between about 0.00001 µm to about 50 µm, about 0.001 µm to about 20 µm, about 0.050 µm to about 5 µm, about 0.0001 µm to about 1 µm, or about 0.1 µm to about 10 µm. In some embodiments, e.g., 5,5"-bis(benzoxazol-2-yl)-3,3':5',3"-terpyridine (IOC-2), the periodicity may be between about 0.0001 µm and about 1.0 µm. In some embodiments, e.g., 3,5-di[3-(benzoxazol-2-yl)phenyl]pyridine (IOC-1), the periodicity may be between about 0.1 µm and about 10.0 µm.

In some embodiments, the largest area of the individual nanostructures as projected within the x,y plane, or a plane parallel to a surface on which a nanostructure is disposed, such as 21 can be about 0.0001 µm$^2$ to about 1.0 µm$^2$, about 0.001 µm$^2$ to about 0.5 µm$^2$, about 1 µm$^2$ to about 3 µm$^2$, or about 0.04 µm$^2$ to about 0.150 µm$^2$ A plurality of nanostructures may be any variety of nanostructures on a surface on which they are disposed, e.g. a surface of an emissive layer such as surface 21. In any given device, nanostructures may be similar to one another, or may vary with respect to size, shape, and arrangement. A nanostructure may include any structure having one or more dimensions in the nanometer to micron range. For example, nanoprotrusions or nanoparticles may have: an average x dimension of about 50 nm to about 5 µm, about 100 nm to about 1 µm, about 50 nm, about 100 nm, about 200 nm, about 300 nm, about 500 nm, about 1 µm, about 2 µm, about 5 µm or any value in a range bounded by, or between, any of these lengths; an average y dimension of about 50 nm to about 5 µm, about 100 nm to about 1 µm, of about 50 nm, about 100 nm, about 200 nm, about 300 nm, about 500 nm, about 1 µm, about 2 µm, about 5 µm or any value in a range bounded by, or between, any of these lengths; and/or an average z dimension of about 0.5 nm to about 500 nm, about 1 nm to about 100 nm, about 0.1 nm, about 0.5 nm, about 1 nm, about 2 nm, about 5 nm, about 10 nm, about 50 nm, about 100 nm, about 200 nm, about 300 nm, about 500 nm, or any value in a range bounded by, or between, any of these lengths.

Figure 4A:
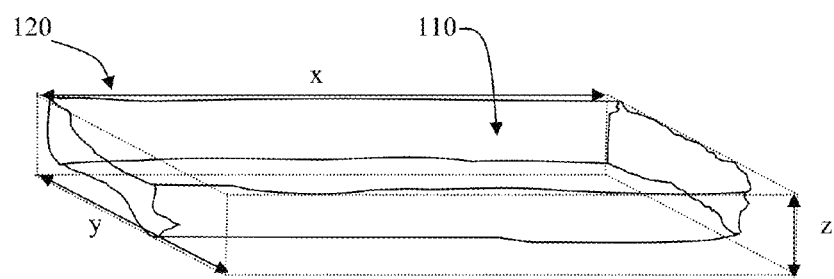
FIG. 4A depicts an idealized example of a particle that may be described as: substantially rectangular when viewed in the xz plane, pseudoplanar, and/or as a curved or wavy nanoflake.

Although nanostructures may be irregularly shaped, three dimensions, x, y, and z, may be quantified as depicted in FIG. 4A. If a box 120 the shape of a rectangular prism is formed around the nanostructures 110, so that the box has the smallest volume possible while still having the particle contained in it, the x dimension is the longest dimension of the box, the y dimension is the second longest dimension of the box, and the z dimension is the third longest dimension of the box.

The three dimensional shapes of the nanostructures may be characterized by describing the shape of the nanostructures when viewed in a certain plane. For example, a nanostructure may be substantially rectangular, substantially square, substantially elliptical, substantially circular, substantially arcuate, substantially triagonal, substantially parallelogramatic, etc., when viewed in the two dimensions of the xy, xz, or yz plane. The particular shape need not be geometrically perfect, but need only be recognizable by an ordinary observer as reasonably similar to a known shape. The three dimensional shape of nanostructures might also be characterized or described using other terms.

Figure 4B:
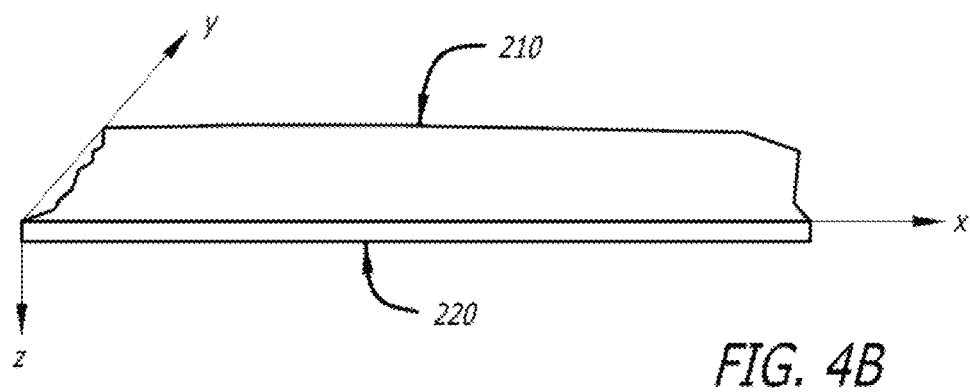
FIG. 4B depicts an idealized example of a nanostructure that is substantially rectangular when viewed in the xz plane.

FIG. 4B depicts an idealized example of a nanostructure 210 that is substantially rectangular 220 when viewed in the xz plane. As depicted in this figure, the nanostructure appears perfectly rectangular, but the shape need only be recognizable as similar to a rectangle to be substantially rectangular when viewed in the xz plane or any other plane.

With respect to FIG. 4B, nanostructure 210 may also be described as substantially linear when viewed in the xz plane because the x dimension is much greater than the z dimension. As depicted in this figure, the nanostructure appears perfectly straight in the x dimension, but the shape need only be recognizable as similar to a line to be substantially linear when viewed in the xz plane or any other plane.

Nanostructure 210 may also be described as a nanoflake. The term "nanoflake" is a broad term that includes nanostructures that are flake-like in shape and have any dimension in the nanometer to micrometer range. This may include nanostructures that are relatively thin in one dimension (e.g. z) and have a relatively large area in another two dimensions (e.g. xy).

The surface having a larger surface area should only be identifiable, but does not need to be planar. For example, the surface having a larger surface area may be substantially in the xy plane, such as nanostructure 210, but may also be curved or wavy, such that substantial portions of the surface are not in the plane.

Nanostructure 210 may also be described as pseudoplanar. The term "pseudoplanar" is a broad term that includes nanostructures that are essentially planar. For example, a pseudoplanar nanostructure may have a z dimension that is relatively insignificant as compared to the xy area of the nanostructure that is substantially in the xy plane.

Figure 4C:
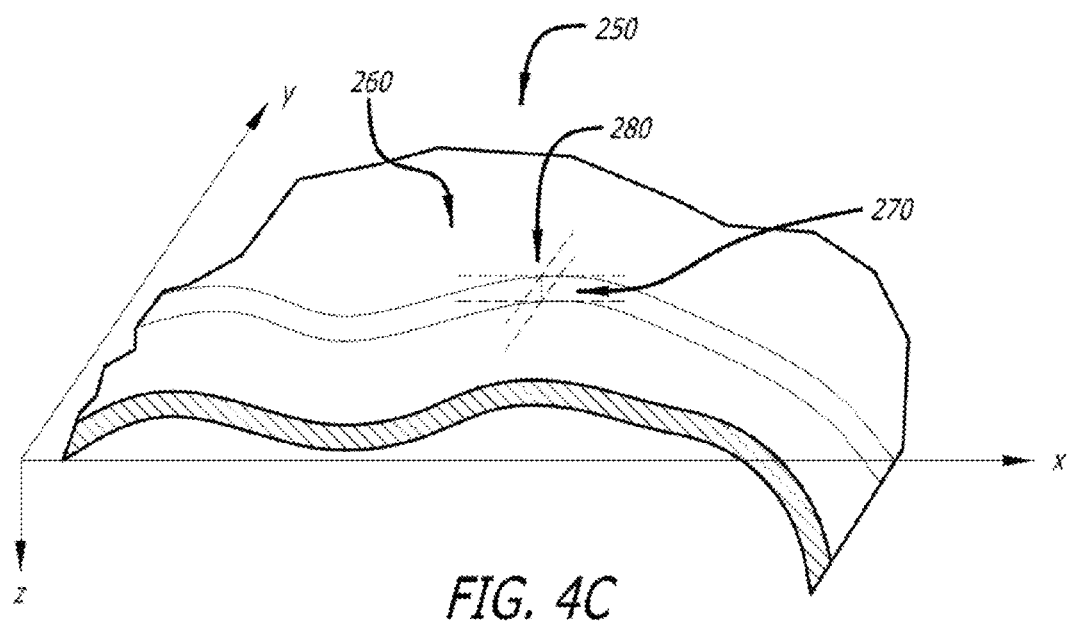
FIG. 4C depicts an example of a curved or wavy nanoflake.

In FIG. 4C, nanostructure 250 is an example of a curved or wavy nanoflake. If substantial portions of the surface are not in the plane, a nanoflake may include nanostructures having a large curved or wavy surface 260 and a small thickness 270 normal to a given point 280 on the surface.

With respect to any nanoflake or pseudoplanar nanostructure, including nanostructure 210, nanostructure 250, and the like, the ratio of the square root of the larger area or surface to a thickness normal to a point on the large surface (such as the ratio of the square root of an xy area to a z dimension), may be about 1 to about 100,000, about 3, about 5, about 10, about 20, about 100, about 1000, about 10,000, about 100,000, or any value in a range bounded by, or between, any of these ratios.

A nanostructure may be described as needlelike if it has a shape that is reasonably recognizable to an ordinary observer as similar to a shape of a needle.

A nanostructure may be described as fiber-shaped if it has a shape that is reasonably recognizable to an ordinary observer as similar to a shape of a fiber. This may include nanostructures that have a surface that is elongated in one dimension and a cylindrical, circular or arcuate surface in another dimension. The fiber-shaped nanostructure can also be substantially linear, twisted or curved.

A nanostructure may be described as ribbon-shaped if it has a shape that is reasonably recognizable to an ordinary observer as similar to the shape of a ribbon. This may include nanostructures that have a flat rectangular surface that is elongated in one dimension and thin in another dimension. The ribbon shape may also be curved or twisted, so that the nanostructure need not be substantially coplanar to be ribbon-shaped.

Figure 5:
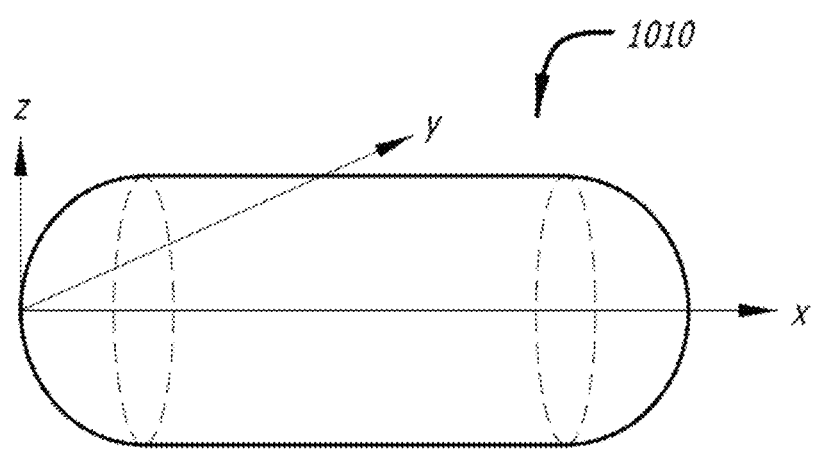
FIG. 5 depicts an idealized example of a substantially capsule-shaped particle.

FIG. 5 depicts an idealized example of a substantially capsule-shaped nanostructure 1010. When viewed in the xy or the xz plane, substantially capsule-shaped nanostructure 1010 may also be described as substantially oval. When viewed in the yz plane, the nanostructure 1010 may also be described as substantially circular.

A nanostructure may be described as rod-shaped if it has a shape that is reasonably recognizable to an ordinary observer as similar to the shape of a rod. This may include nanostructures that are elongated in one dimension. A rod-shaped nanostructure may be substantially straight, or have some curvature or bending.

A nanostructure may be described as granular if the x, y, and z dimensions are similar, such as within an order of magnitude of one another.

A nanostructure may be described as dome-shaped if it has a shape that is reasonably recognizable to an ordinary observer as similar to the shape of a dome or hemisphere. This may include nanostructures that are substantially circular or oval in one dimension or plane, e.g., the xy plane, and arcuate or circular in another dimension, e.g., the xz and/or yz plane. The radii of each such arcuate, circular or oval shape can vary or be substantially uniform from nanostructure to nanostructure or within the same nanostructure.

FIGS. 6A-6F depict SEM images of an embodiment of nanostructure material (IOC-1). Although not exhaustive, the following descriptions may apply to at least one of the protrusions or particles in this figure when viewed in the xy plane: circular, oval, ribbon-shaped, fiber-shaped and/or capsule. Although not exhaustive, the following descriptions may apply to at least one of the protrusions or particles in this figure when viewed in the yz plane: substantially fiber, linear, rod shaped. Although not exhaustive, the following other descriptions may also apply to at least one of the protrusions or particles in this figure: fiber, ribbon-like.

Figure 6A:
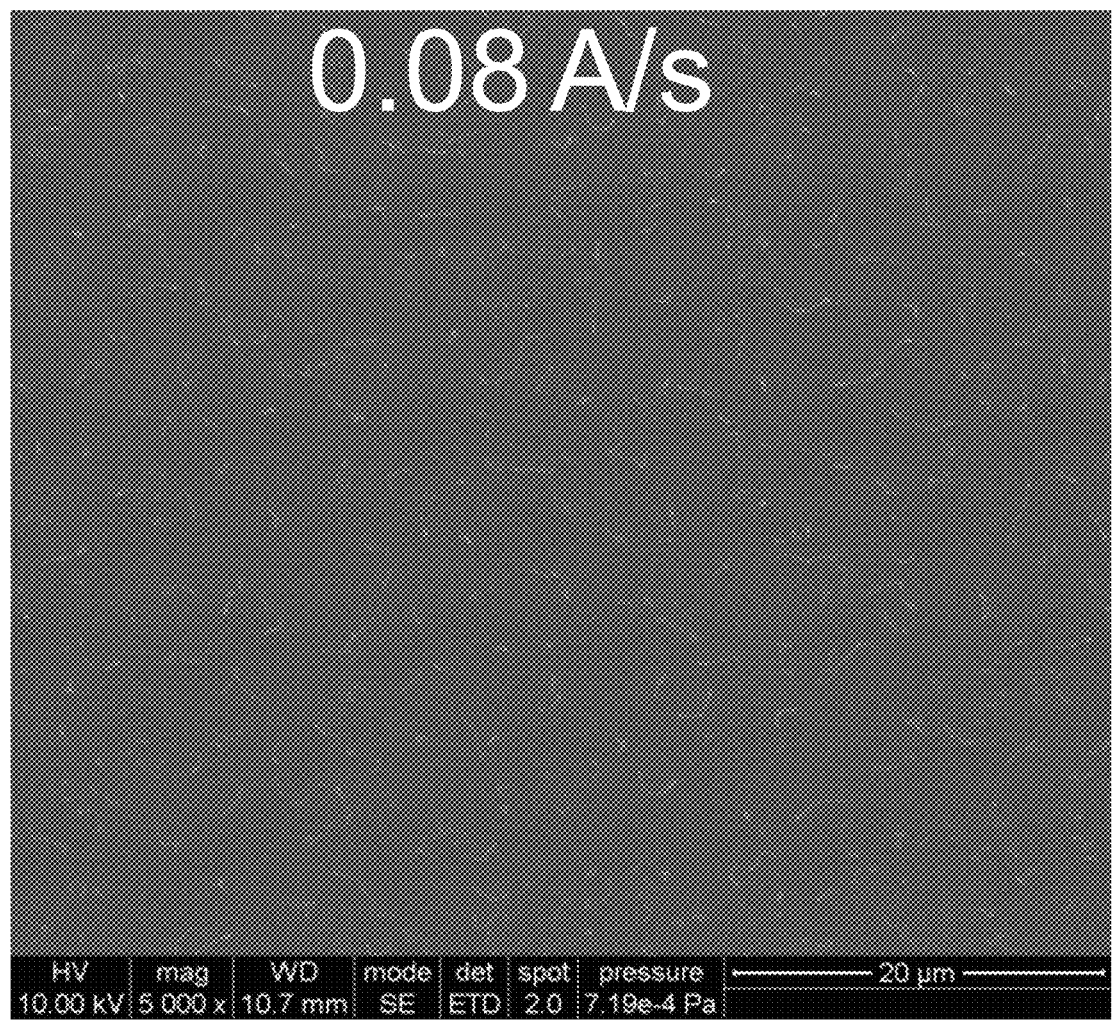
FIGS. 6A-6I depict scanning electron microscope images of surfaces comprising some embodiments of nanostructures deposited at different deposition rates.
Figure 6B:
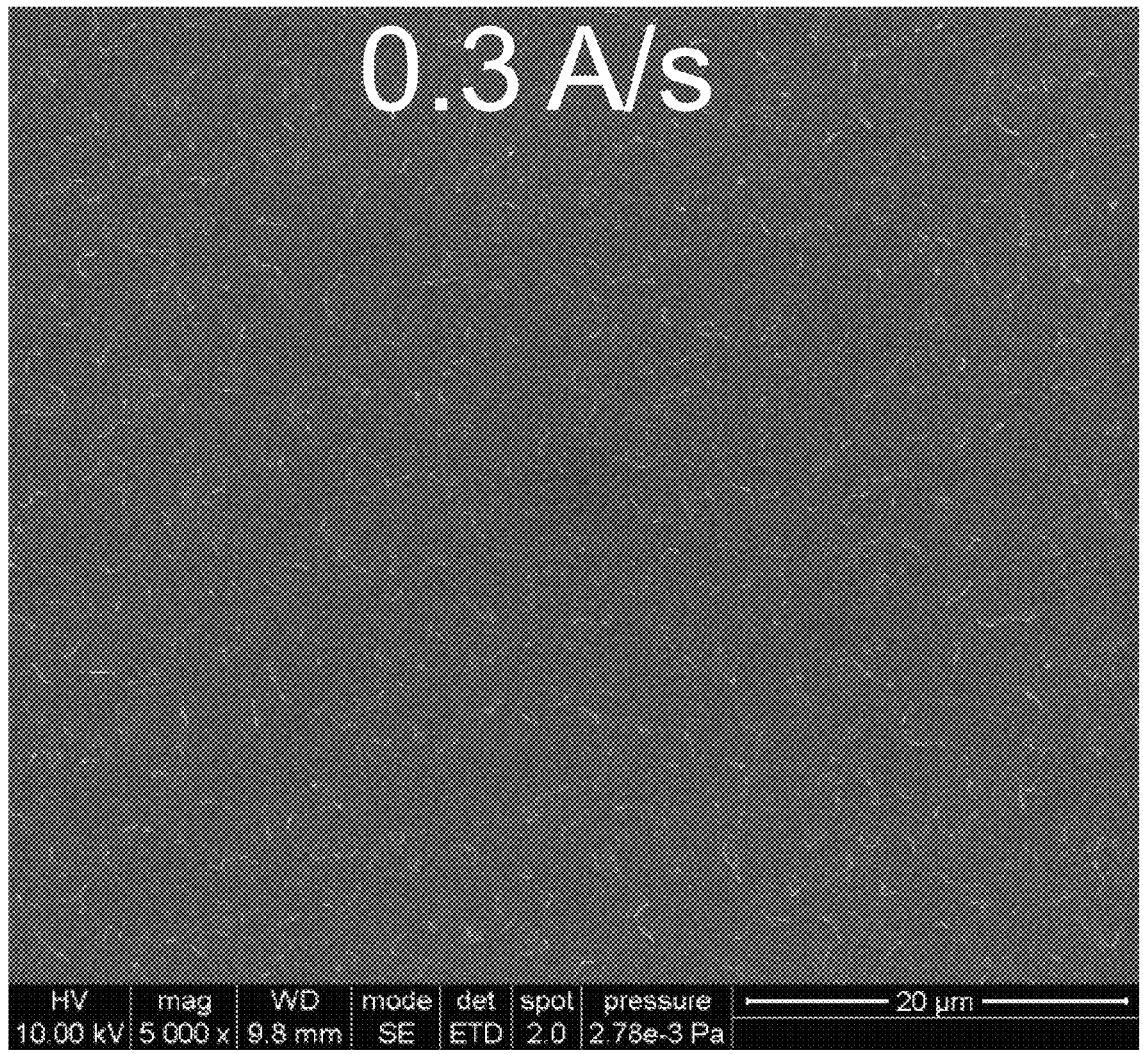
Figure 6C:
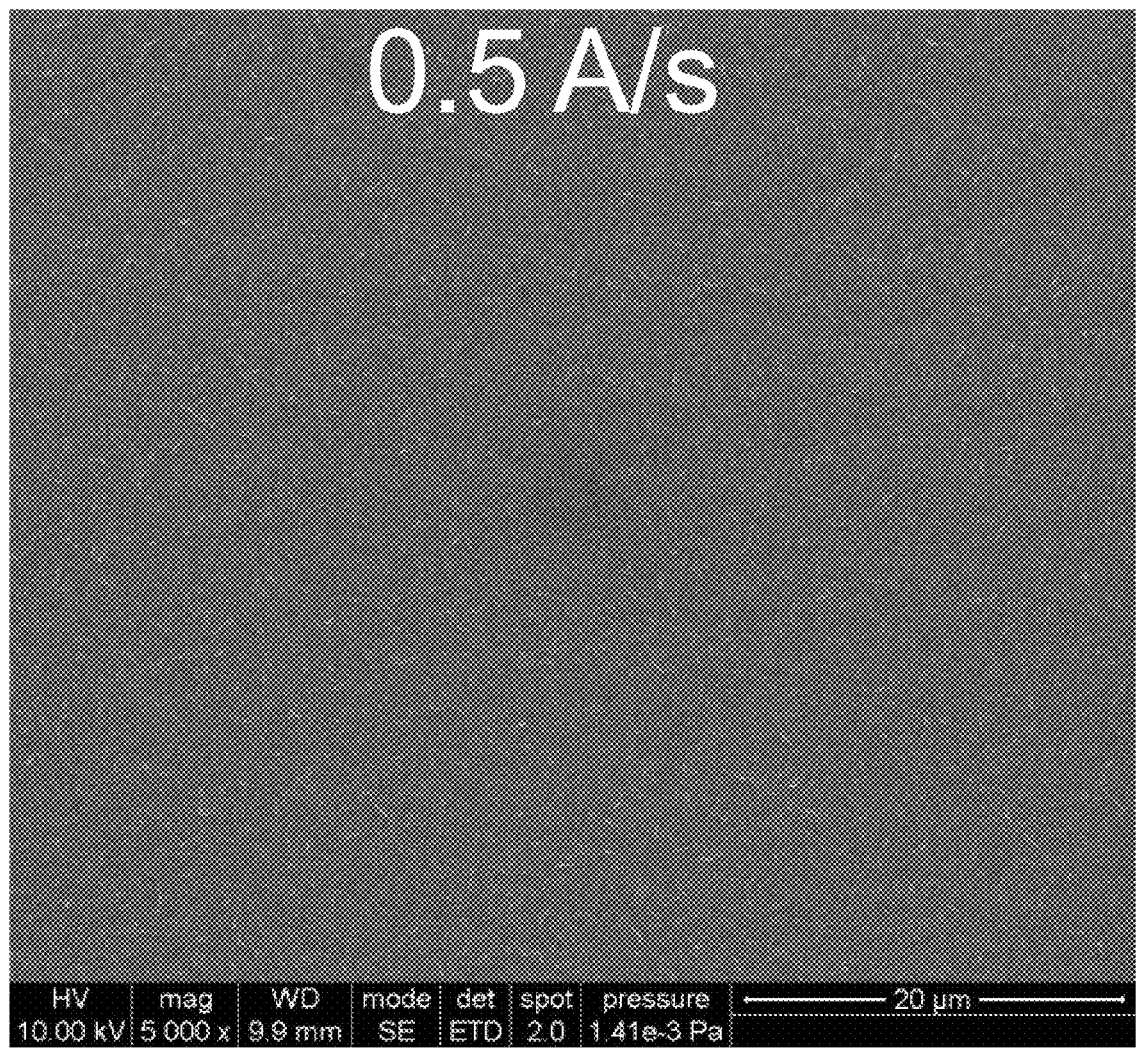
Figure 6D:
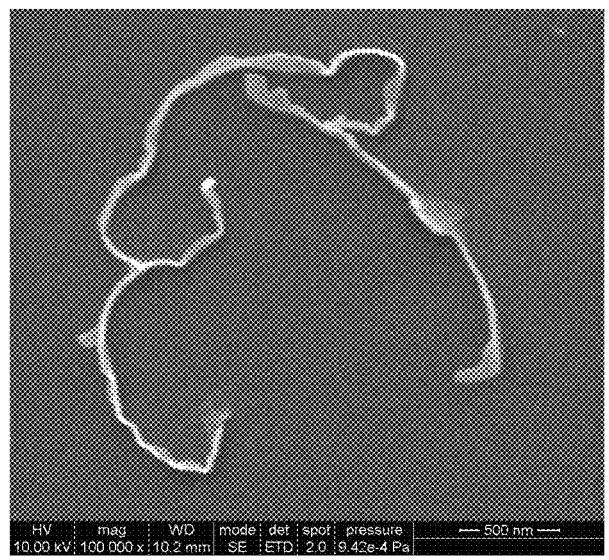
Figure 6E:
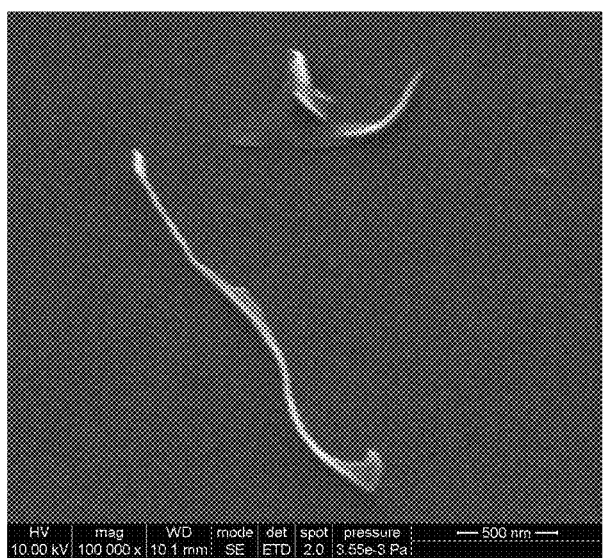
Figure 6F:
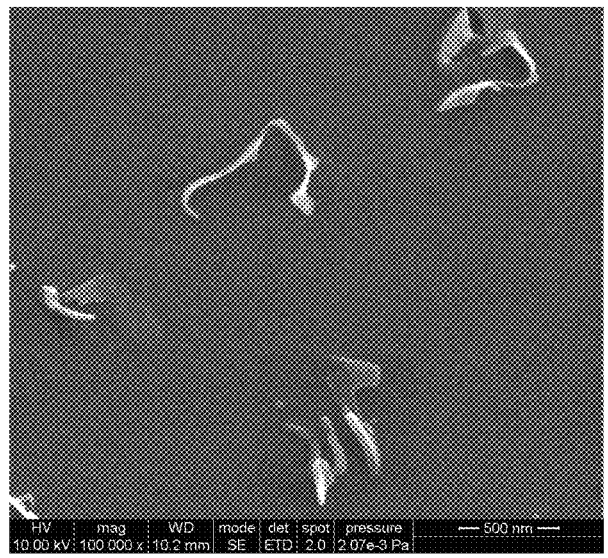
Figure 6G:
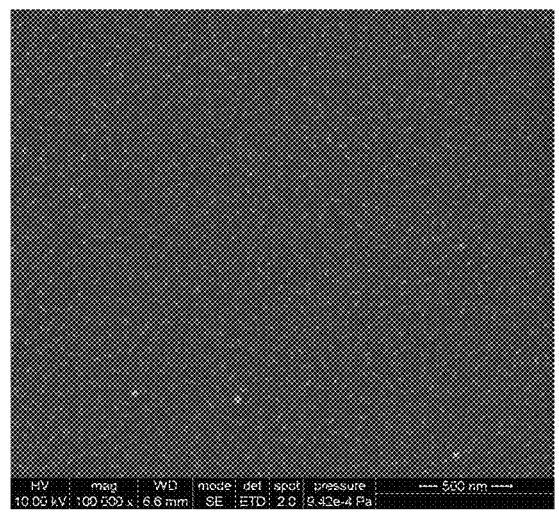
Figure 6H:
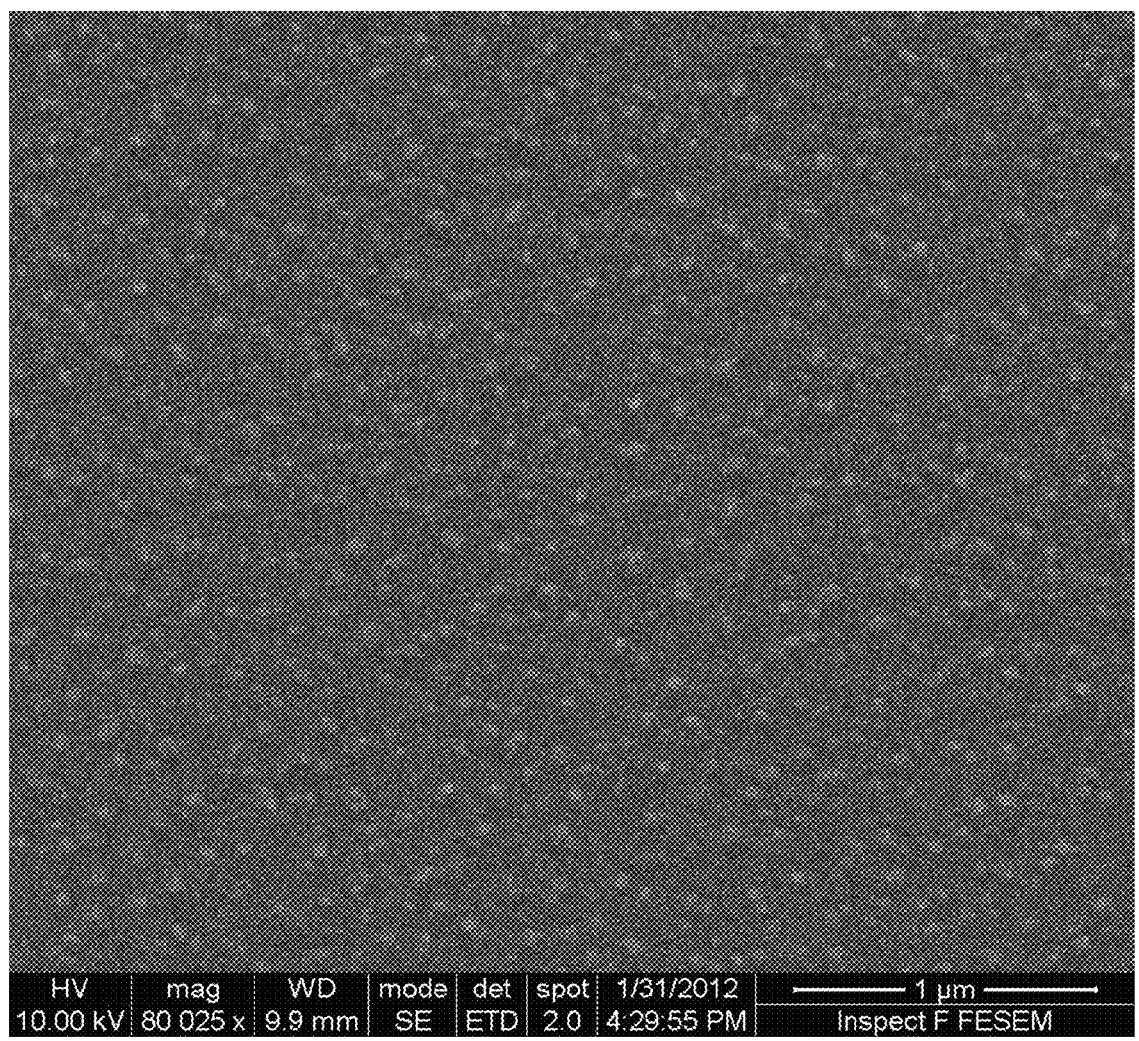
Figure 6I:
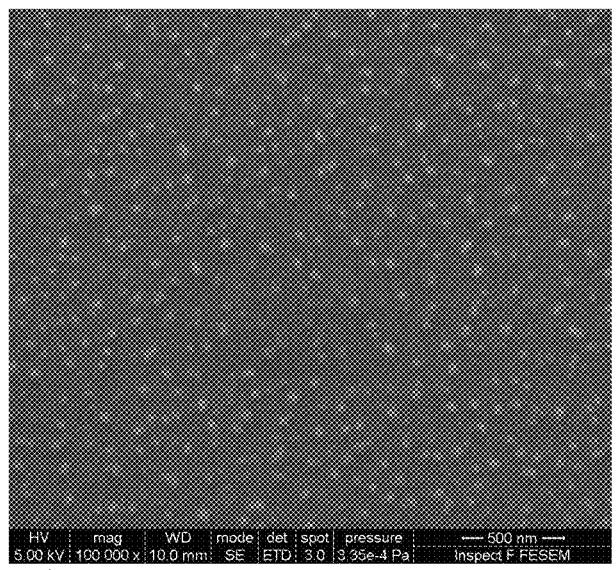

FIGS. 6G-6I depict SEM images of a surface of nanostructure embodiments (6G:IOC-2, 6H and 6I: IOC-3). Although not exhaustive, the following descriptions may apply to at least one of the protrusions or particles in this figure when viewed in the xy plane: circular, oval, dome-shaped or hemispherical. Although not exhaustive, the following descriptions may apply to at least one of the protrusions or particles in this figure when viewed in the yz plane: substantially arcuate or hemispherical. Although not exhaustive, the following other descriptions may also apply to at least one of the protrusions or particles in this figure: fiber, ribbon-like.

Scale bars of 500 nm 20 μm are indicated in the SEM's (FIGS. 6A-6I), which may provide an indication of the size of the nanoparticles, nanoprotrusions, or voids of the film. This figure shows that a substantial number of particles or voids may have an x, y, and/or z dimension in the range of about 0.1 nm to about 5 μm.

The refractive index of a nanostructure material may vary. For example, the refractive index may be about 1.1, about 1.5, about 1.7, about 1.8, or any refractive index in a range bounded by, or between, any of these values. In some embodiments, the refractive index of the material of a nanostructure material may be greater than or equal to that of the emissive layer.

Charge-transfer properties of a nanostructure material may vary according to the structure of a device. For example, nanostructure material disposed between a light-emitting layer and a hole-transport layer may have hole-transport properties. Similarly, nanostructure material disposed between a light-emitting layer and an electron-transport layer may have electron-transport properties. In some embodiments, the charge-transfer properties of the nanostructure material are such that including the nanostructure material has a minimal, or substantially no effect, upon the mobility of holes or electrons from an electrode to an emissive layer.

In some embodiments, a nanostructure material may comprise an organic compound, including a nonpolymeric organic compound with a molecular weight in the range of about 60 g/mol to about 2000 g/mol or about 120 g/mol to about 1000 g/mol. In some embodiments, a nanostructure material may have a stable planar conformation.

Some nanostructure materials comprise an optionally substituted aromatic or heteroaromatic ring or ring system, such as optionally substituted phenyl, optionally substituted pyridinyl, optionally substituted carbazolyl, optionally substituted benzimidazole, optionally substituted benzoxazole, optionally substituted benzothiazole, etc.

In some embodiments, the nanostructure materials may be linear, such as materials wherein non-terminal rings are optionally substituted 1,3-phenylene, optionally substituted 1,4-phenylene, optionally substituted 2,4-pyridinylene, optionally substituted 2,5-pyridinylene, or a similarly attached monocyclic arylene. Some nanostructure materials may include a compound having a terminal benzothiazole or benzoxazole.

Some nanostructure materials comprise optionally substituted 4-(benzoxazol-2-yl)-4'-(4-diphenylaminophenyl)-3,3'-bipyridine; optionally substituted 4-(benzoxazol-2-yl)-4"-(carbazol-1-yl)terphenyl; optionally substituted 2-(4"-(9H-carbazol-9-yl)-[1,1':4',1"-terphenyl]-4-yl)benzo[d]thiazole; optionally substituted 4-(benzoxazol-2-yl)-4"-[di(4-methylphenyl)amino]terphenyl; optionally substituted 4"-(benzothiazol-2-yl)-4"-[di(4-methylphenyl)amino]terphenyl; optionally substituted 4"-(benzo[d]oxazol-2-yl)-N,N-diphenyl-[1,1':4',1"-terphenyl]-4-amine; optionally substituted 5,5'-bis(benzoxazol-2-yl)-3,3'-bipyridine; optionally substituted 5,5'-bis(benzothiazol-2-yl)-3,3'-bipyridine; optionally substituted 3,3'-bis(benzoxazol-2-yl)-2,2'-bipyridine; optionally substituted 3,3'-bis(benzo[d]thiazol-2-yl)-2,2'-bipyridine; optionally substituted 5,5'-bis(1-phenyl-1H-benzo[d]imidazol-2-yl)-3,3'-bipyridine; optionally substituted 3,5-di[3-(benzoxazol-2-yl)phenyl]pyridine (IOC-1); optionally substituted 3,5-bis(3-(benzo[d]thiazol-2-yl)phenyl)pyridine; optionally substituted 3,5-di[5-(benzoxazol-2-yl)pyridin-3-yl]benzene; optionally substituted 1,3-bis(5-(benzo[d]thiazol-2-yl)pyridin-3-yl)benzene; optionally substituted 5,5"-bis(benzoxazol-2-yl)-3,3':5',3"-terpyridine (IOC-2); optionally substituted 5,5"-bis(benzothiazol-2-yl)-3,3':5',3"-terpyridine; optionally substituted 4-(benzoxazol-2-yl)-4"-[di(4-methylphenyl)amino]terphenyl; optionally substituted 4-(benzoxazol-2-yl)-4"-(diphenylamino)terphenyl; optionally substituted 4-(benzothiazol-2-yl)-4"-(diphenylamino)terphenyl; optionally substituted 4-(benzothiazol-2-yl)-4'-(4-diphenylaminophenyl)-3,3'-bipyridine; optionally substituted 4-(benzothiazol-2-yl)-4'-[4-(carbazol-1-yl)phenyl]-3,3'-bipyridine; optionally substituted 4-(benzoxazol-2-yl)-4'-[4-(carbazol-1-yl)phenyl]-3,3'-bipyridine; optionally substituted 6,6'-bis(benzo[d]thiazol-2-yl)-3,3'-bipyridine; optionally substituted 6,6'-bis(benzo[d]oxazol-2-yl)-3,3'-bipyridine; optionally substituted 3,5-di[5-(benzothiazol-2-yl)pyridin-3-yl]-1-methylbenzene; optionally substituted 3,5-di[5-(benzoxazol-2-yl)pyridin-3-yl]-1-methylbenzene; optionally substituted 3,3"-bis(benzo[d]oxazol-2-yl)-1,1':3',1"-terphenyl; optionally substituted 2,2'-(5'-vinyl-[1,1':3',1"-terphenyl]-3,3"-diyl)bis(benzo[d]oxazole); optionally substituted 3,5-di([1,1'-biphenyl]-3-yl)pyridine; optionally substituted 1,1':3',1":3",1"':3"',1""-quinquephenyl; optionally substituted 3,3',5,5'-tetrakis(benzo[d]oxazol-2-yl)-1,1'-biphenyl (IOC-3); or optionally substituted 3,3',5,5'-tetrakis(benzo[d]thiazol-2-yl)-1,1'-biphenyl.

Unless otherwise indicated, when a compound or chemical structural feature such as aryl is referred to as being "optionally substituted," it includes a feature that has no substituents (i.e. be unsubstituted), or a feature that is "substituted," meaning that the feature has one or more substituents. The term "substituent" has the ordinary meaning known to one of ordinary skill in the art, and includes a moiety that replaces one or more hydrogen atoms attached to a parent compound or structural feature. In some embodiments, the substituent may be an ordinary organic moiety known in the art, which may have a molecular weight (e.g. the sum of the atomic masses of the atoms of the substituent) of 15 g/mol to 50 g/mol, 15 g/mol to 100 g/mol, 15 g/mol to 150 g/mol, 15 g/mol to 200 g/mol, 15 g/mol to 300 g/mol, or 15 g/mol to 500 g/mol. In some embodiments, the substituent comprises: 0-30, 0-20, 0-10, or 0-5 carbon atoms; and 0-30, 0-20, 0-10, or 0-5 heteroatoms that are independently: N, O, S, Si, F, Cl, Br, or I; provided that the substituent comprises at least one atom that is: C, N, O, S, Si, F, Cl, Br, or I. Examples of substituents include, but are not limited to, alkyl, alkenyl, alkynyl, heteroalkyl, heteroalkenyl, heteroalkynyl, aryl, heteroaryl, hydroxy, alkoxy, aryloxy, acyl, acyloxy, alkylcarboxylate, thiol, alkylthio, cyano, halo, thiocarbonyl, O-carbamyl, N-carbamyl, O-thiocarbamyl, N-thiocarbamyl, C-amido, N-amido, S-sulfonamido, N-sulfonamido, isocyanato, thiocyanato, isothiocyanato, nitro, silyl, sulfenyl, sulfinyl, sulfonyl, haloalkyl, haloalkoxyl, trihalomethanesulfonyl, trihalomethanesulfonamido, amino, etc.

For convenience, the term "molecular weight" is used with respect to a moiety or part of a molecule to indicate the sum of the atomic masses of the atoms in the moiety or part of a molecule, even though it may not be a complete molecule.

Structures associated with some of the chemical names referred to herein are depicted below. These structures may be unsubstituted, as shown below, or a substituent may independently be in any position normally occupied by a hydrogen atom when the structure is unsubstituted. Unless a point of attachment is indicated by

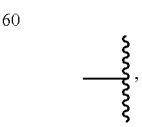

attachment may occur at any position normally occupied by a hydrogen atom.

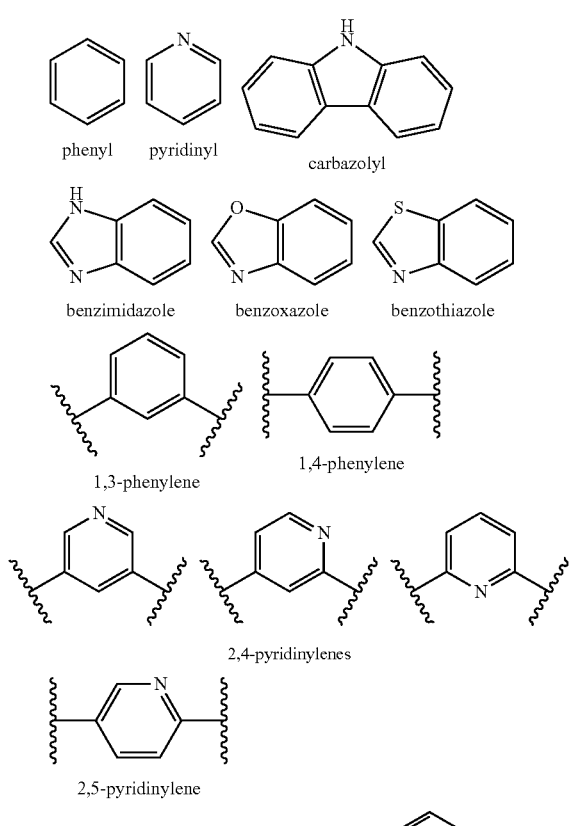
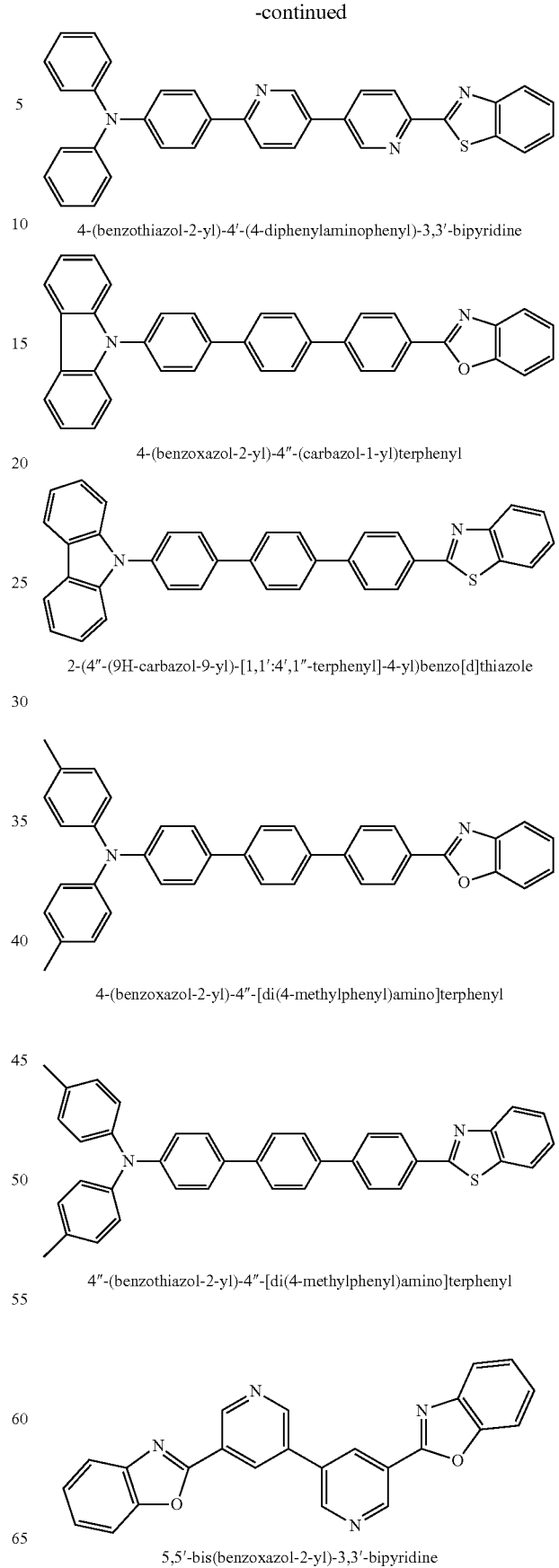

-continued

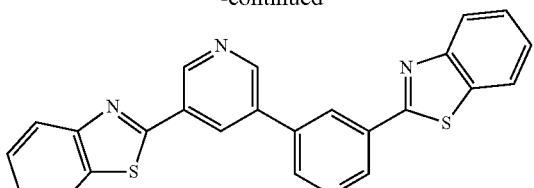
5,5'-bis(benzothiazol-2-yl)-3,3'-bipyridine

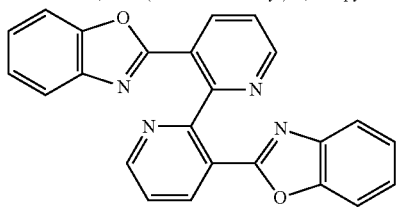
3,3'-bis(benzoxazol-2-yl)-2,2'-bipyridine

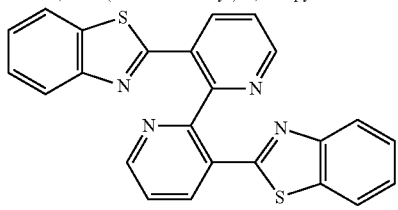
3,3'-bis(benzo[d]thiazol-2-yl)-2,2'-bipyridine

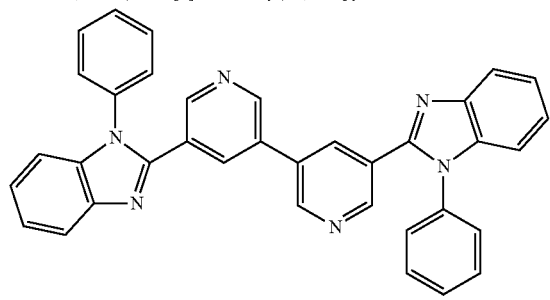
5,5'-bis(1-phenyl-1H-benzo[d]imidazol-2-yl)-3,3'-bipyridine

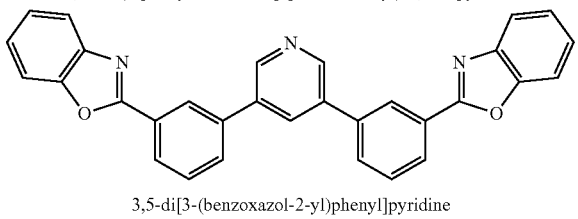
3,5-di[3-(benzoxazol-2-yl)phenyl]pyridine

IOC-1

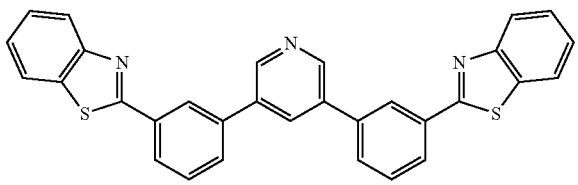
3,5-bis(3-(benzo[d]thiazol-2-yl)phenyl)pyridine

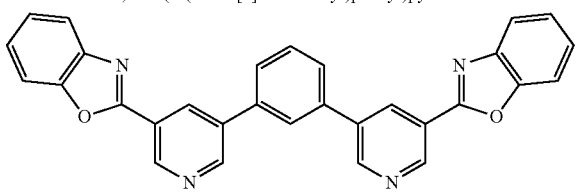
3,5-di[5-(benzoxazol-2-yl)pyridin-3-yl]benzene

-continued

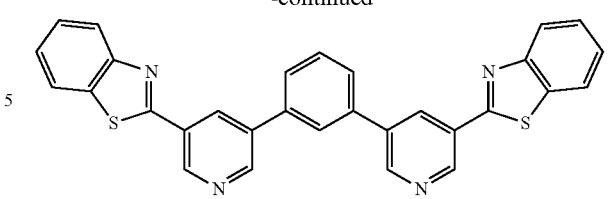
1,3-bis(5-(benzo[d]thiazol-2-yl)pyridin-3-yl)benzene

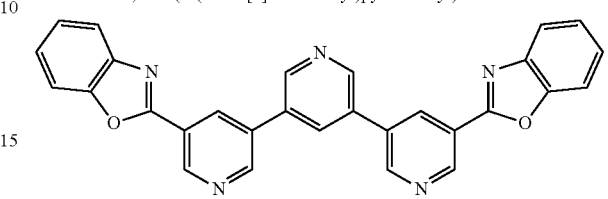
5,5''-bis(benzoxazol-2-yl)-3,3':5',3''-terpyridine

IOC-2

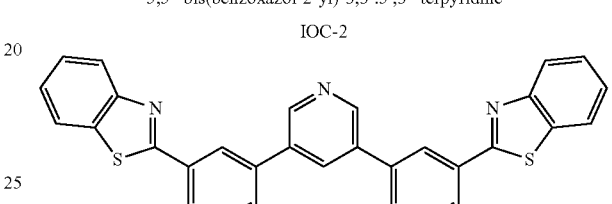
5,5''-bis(benzothiazol-2-yl)-3,3':5',3''-terpyridine

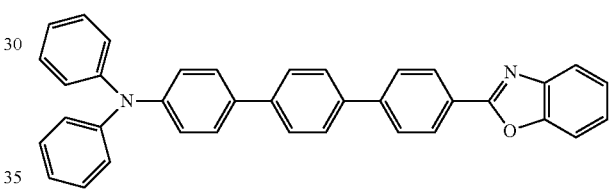
4-(benzoxazol-2-yl)-4''-(diphenylamino)terphenyl

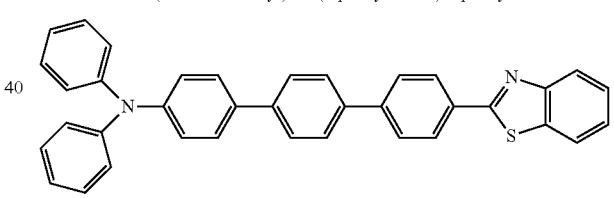
4-(benzothiazol-2-yl)-4''-(diphenylamino)terphenyl

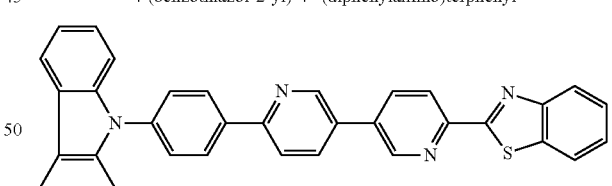
4-(benzothiazol-2-yl)-4'-[4-(carbazol-1-yl)phenyl]-3,3'-bipyridine

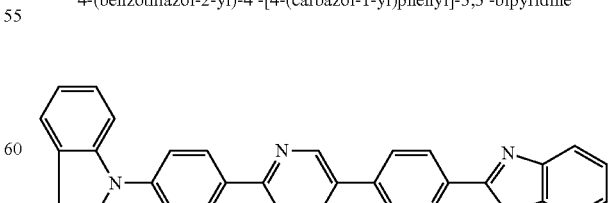
4-(benzoxazol-2-yl)-4'-[4-(carbazol-1-yl)phenyl]-3,3'-bipyridine

-continued

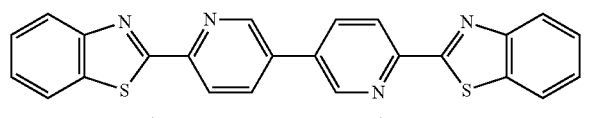
6,6'-bis(benzo[d]thiazol-2-yl)-3,3'-bipyridine

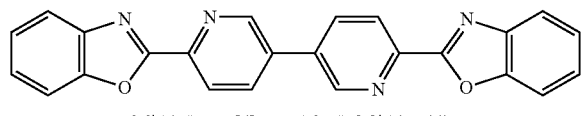
6,6'-bis(benzo[d]oxazol-2-yl)-3,3'-bipyridine

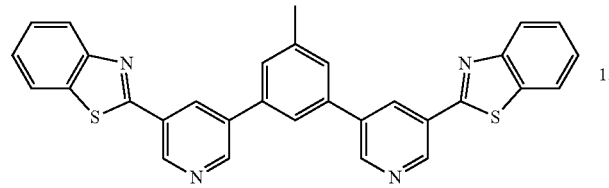
3,5-di[5-(benzothiazol-2-yl)pyridin-3-yl]-1-methylbenzene

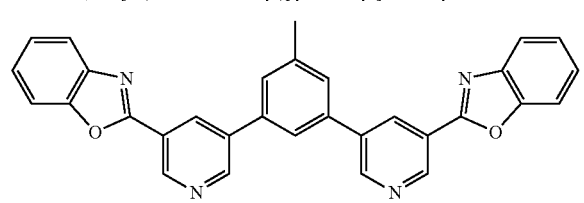
3,5-di[5-(benzoxazol-2-yl)pyridin-3-yl]-1-methylbenzene

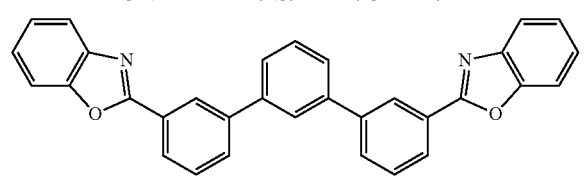
3,3"-bis(benzo[d]oxazol-2-yl)-1,1':3',1"-terphenyl

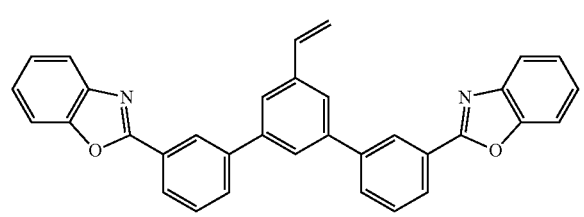
2,2'-(5'-vinyl-[1,1':3',1"-terphenyl]-3,3"-diyl)bis(benzo[d]oxazole)

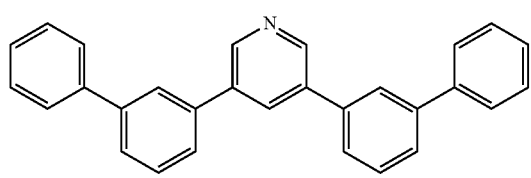
3,5-di([1,1'-biphenyl]-3-yl)pyridine

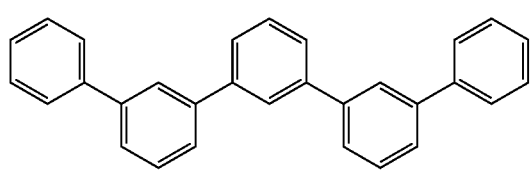
1,1':3',1":3"',1"''-quinquephenyl

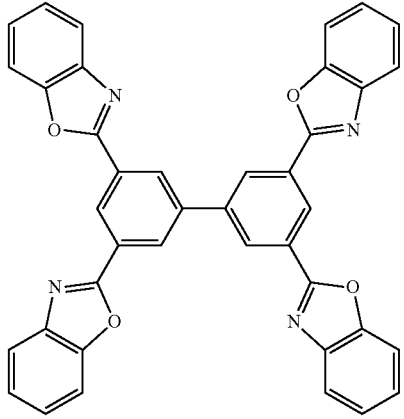
3,3',5,5'-tetrakis(benzo[d]oxazol-2-yl)-1,1'-biphenyl (IOC-3)

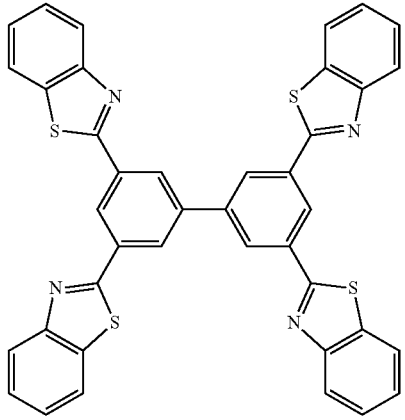
3,3',5,5'-tetrakis(benzo[d]thiazol-2-yl)-1,1'-biphenyl

In some embodiments, an internal ring, such as optionally substituted 1,3-phenylene, optionally substituted 1,4-phenylene, optionally substituted 2,4-pyridinylene, or optionally substituted 2,5-pyridinylene, may be unsubstituted, or may have substituents with a small steric bulk, such as F, OH, $NH_2$, or CN. In some embodiments, terminal rings may be unsubstituted, or may have substituents such as R', —OR', —COR', —$CO_2$R', —OCOR', —NR'COR", CONR'R", —NR'R", F; Cl; Br; I; nitro; CN, etc., wherein R' and R" are independently H, optionally substituted phenyl, or $C_{1-6}$ alkyl, such as methyl, ethyl, propyl isomers, cyclopropyl, butyl isomers, cyclobutyl isomers (such as cyclobutyl, methylcyclopropyl, etc.), pentyl isomers, cyclopentyl isomers, hexyl isomers, cyclohexyl isomers, etc.

Other compounds that may be useful as nanostructure materials include any compound described in one of the following documents: U.S. Provisional Application No. 61/449,034, filed Mar. 3, 2011, which is incorporated by reference for all disclosure related to new compounds; U.S. Provisional Application No. 61/221,472, filed Jun. 29, 2009, which is incorporated by reference for all disclosure related to new compounds; U.S. patent application Ser. No. 12/825,953, filed Jun. 29, 2010, and published as US 20100326526, which is incorporated by reference for all disclosure related to new compounds; U.S. Provisional Patent Application No. 61/383,602, filed Sep. 16, 2010, which is incorporated by reference for all disclosure related to new compounds; U.S. Provisional Application No. 61/426,259, filed Dec. 22, 2010; which is incorporated by reference for all disclosure related to new compounds; and copending application Ser. No. 13/232,837, filed Sep. 14, 2011, and published as US 2012-0179089, which is incorporated by reference for all disclosure related to new compounds; Ser. No. 13/410,602, filed Mar. 2, 2012, which is incorporated by reference for all disclosure related to new compounds; Ser. No. 13/410,778, filed Mar. 2, 2012, and published as US 20120226046, which is incorporated by reference for all disclosure related to new compounds; Ser. No. 13/033,473, filed Feb. 23, 2011, and published as US 20110140093, which is incorporated by reference for all disclosure related to new compounds; and Ser. No. 61/696,035, filed Aug. 31, 2012, which is incorporated by reference for all disclosure related to new compounds.

In some embodiments, a nanostructure material disposed on a surface of a light-emitting layer may have a total mass of about 1 ng to about 500 ng, about 10 ng to about 100 ng, or about 20 ng to about 60 ng for each $cm^2$ of area of the surface of the light-emitting layer.

In some embodiments, the nominal thickness of a nanostructure material measured by the Quartz Crystal microbalance, which measures the mass deposited onto it, is about 0.0001 nm to about 50 nm or about 0.001 nm to about 10 nm. In some embodiments, the light extraction layer is a discontinuous layer including apertures or voids between islands of light extraction material.

In some embodiments, a nanostructure material may be substantially transparent or substantially translucent.

Nanostructures may be deposited by vacuum evaporation and can self-assemble into various types of nanostructures described above, depending on the deposition rate. The size and distribution of nanostructures may depend on the deposition rate of the materials. For example, nanostructures may become smaller in all dimensions with increasing deposition rate. In some embodiments, the deposition rate may be about 0.005 nm/s to about 500 nm/s, about 0.005 nm/s, about 0.01 nm/s, about 0.02 nm/s, about 0.03 nm/s, about 0.05 nm/s, about 0.08 nm/s, about 0.1 nm/s, about 0.2 nm/s, about 0.5 nm/s, about 1 nm/s, about 10 nm/s, about 100 nm/s, or any value in a range bounded by, or between, any of these deposition rates. In some embodiments, output enhancement, e.g. the amount of light extracted from the device, may increase with the deposition rate. In some embodiments, output enhancement, e.g. the amount of light extracted from the device, may increase with the deposition rate being between about 0.01 Å/s to about 1.5 Å/s.

In some embodiments, the periodicity (separation) of the nanostructure material within or upon the deposed surface, e.g., the light-emitting layer, may vary.

An anode, e.g. anode 10, may be a layer comprising a conventional material such as a metal, a mixed metal, an alloy, a metal oxide or a mixed-metal oxide, a conductive polymer, and/or an inorganic material such as a carbon nanotube (CNT). Examples of suitable metals include the Group 1 metals, the metals in Groups 4, 5, 6, and the Group 8-10 transition metals. If the anode layer is to be light-transmitting, metals in Group 10 and 11, such as Au, Pt, and Ag, or alloys thereof; or mixed-metal oxides of Group 12, 13, and 14 metals, such as indium-tin-oxide (ITO), indium-zinc-oxide (IZO), and the like, may be used. If the anode layer is to be light-transmitting, e.g., bottom emitting light-emitting diode construction, the anode layer may include a transparent substrate upon which the light-emitting material is disposed. Suitable transparent materials include, but are not limited to, glass, transparent polymers and transparent plastics. In some embodiments, the anode layer may be an organic material such as polyaniline. The use of polyaniline is described in "Flexible light-emitting diodes made from soluble conducting polymer," Nature, vol. 357, pp. 477-479 (11 Jun. 1992). In some embodiments, the anode layer can have a thickness in the range of about 1 nm to about 1000 nm.

A cathode, e.g. cathode 35, may be a layer including a material having a lower work function than the anode layer. Examples of suitable materials for the cathode layer include mixed-metal oxides of Group 12, 13, and 14 metals, such as indium-tin-oxide (ITO), indium-zinc-oxide (IZO), alkali metals of Group 1, Group 2 metals, Group 12 metals, including rare earth elements, lanthanides and actinides, materials such as aluminum, indium, calcium, barium, samarium and magnesium, and combinations thereof. Li-containing organometallic compounds, LiF, and $Li_2O$ may also be deposited between the organic layer and the cathode layer to lower the operating voltage. Suitable low work function metals include but are not limited to Al, Ag, Mg, Ca, Cu, Mg/Ag, LiF/Al, CsF, CsF/Al, ITO, IZO or alloys thereof. In some embodiments, the cathode layer can have a thickness in the range of about 1 nm to about 1000 nm.

A light-emitting layer, e.g. light-emitting layer 20, may comprise a light-emitting component and a subject compound as a host. Suitable host materials include, but are not limited to those described in co-pending patent applications, U.S. Patent Publication 2011/0140093 (13/033,473, filed 23 Feb. 2011). In some embodiments, the host may be any of:

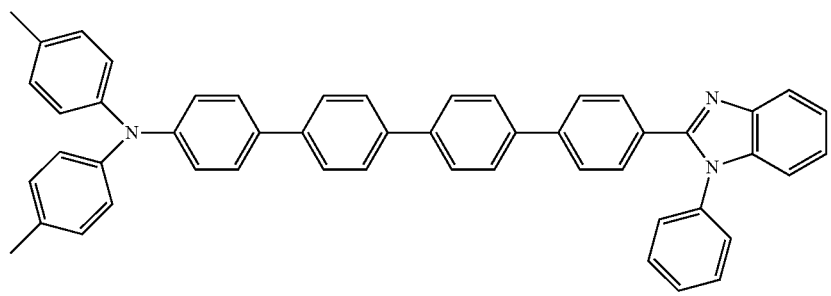

4'''-(1-phenyl-1H-benzo[d]imidazol-2-yl)-N,N-di-p-tolyl-[1,1':4',1":4",1'''-quaterphenyl]-4-amine (Host-1)

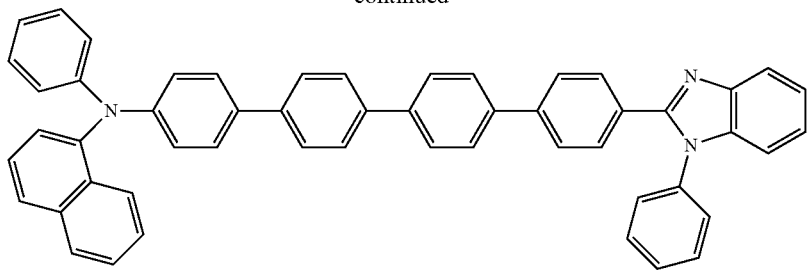

9-(4'''-(1-phenyl-1H-benzo[d]imidazol-2-yl)-[1,1':4',1":4",1'''-quaterphenyl]-4-yl)-9H-carbazole (Host-2)

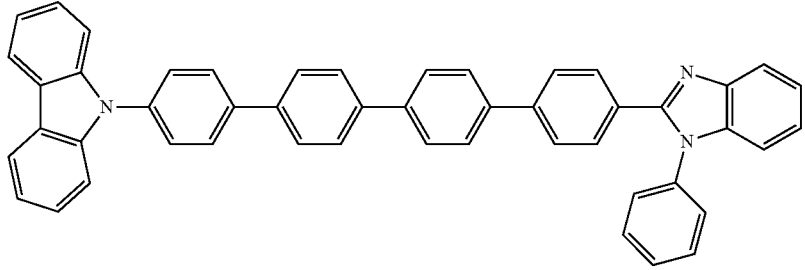

9-(4'''-(1-phenyl-1H-benzo[d]imidazol-2-yl)-[1,1':4',1":4",1'''-quaterphenyl]-4-yl)-9H-carbazole (Host-3)

The amount of the host in a light-emitting layer may vary. In some embodiments, the amount of a host in a light-emitting layer is in the range of from about 70% to nearly 100% by weight of the light-emitting layer, such as about 90% to about 99%, or about 97% by weight of the light-emitting layer. In some embodiments, the mass of the light-emitting component is about 0.1% to about 10%, about 1% to about 5%, or about 3% of the mass of the light-emitting layer. The light-emitting component may be a fluorescent and/or a phosphorescent compound.

A light-emitting component may comprise an iridium coordination compound such as: bis-{2-[3,5-bis(trifluoromethyl)phenyl]pyridinato-N,C2'}iridium(III)-picolinate; bis (2-[4,6-difluorophenyl]pyridinato-N,C2')iridium (III) picolinate; bis(2-[4,6-difluorophenyl]pyridinato-N,C2')iridium (acetylacetonate); Iridium (III) bis(4,6-difluorophenylpyridinato)-3-(trifluoromethyl)-5-(pyridine-2-yl)-1,2,4-triazolate; Iridium (III) bis(4,6-difluorophenylpyridinato)-5-(pyridine-2-yl)-1H-tetrazolate; bis[2-(4,6-difluorophenyl)pyridinato-N,C2']iridium(III)tetra (1-pyrazolyl)borate; bis[2-(2'-benzothienyl)-pyridinato-N,C3']iridium (III)(acetylacetonate); bis[(2-phenylquinolyl)-N,C2']iridium (III) (acetylacetonate); bis[(1-phenylisoquinolinato-N,C2')]iridium (III) (acetylacetonate); bis[(dibenzo[f,h]quinoxalino-N,C2')iridium (III)(acetylacetonate); tris(2,5-bis-2'-(9',9'-dihexylfluorene)pyridine)iridium (III); tris[1-phenylisoquinolinato-N,C2']iridium (III); tris-[2-(2'-benzothienyl)-pyridinato-N,C3']iridium (III); tris [1-thiophen-2-ylisoquinolinato-N,C3']iridium (III); tris[1-(9,9-dimethyl-9H-fluoren-2-yl)isoquinolinato-(N,C3')iridium (III)); bis(2-phenylpyridinato-N,C2')iridium(III) (acetylacetonate) [Ir(ppy)₂(acac)]; bis(2-(4-tolyl)pyridinato-N,C2')iridium(III)(acetylacetonate) [Ir(mppy)₂(acac)]; bis (2-(4-tert-butyl)pyridinato-N,C2')iridium (III) (acetylacetonate) [Ir(t-Buppy)₂(acac)]; tris(2-phenylpyridinato-N,C2')iridium (III) [Ir(ppy)₃]; bis(2-phenyloxazolinato-N,C2')iridium (III) (acetylacetonate) [Ir (op)₂(acac)]; tris(2-(4-tolyl)pyridinato-N,C2')iridium(III) [Ir (mppy)₃]; bis[2-phenylbenzothiazolato-N,C2')iridium (III) (acetylacetonate); bis[2-(4-tert-butylphenyl) benzothiazolato-N,C2']iridium(III)(acetylacetonate); bis[(2-(2'-thienyl)pyridinato-N,C3')]iridium (III) (acetylacetonate); tris[2-(9,9-dimethylfluoren-2-yl)pyridinato-(N,C3')]iridium (III); tris[2-(9,9-dimethylfluoren-2-yl)pyridinato-(N,C3')] iridium (III); bis[5-trifluoromethyl-2-[3-(N-phenylcarbzolyl)pyridinato-N,C2']iridium(III)(acetylacetonate); (2-Ph-PyCz)₂Ir(III)(acac); etc.

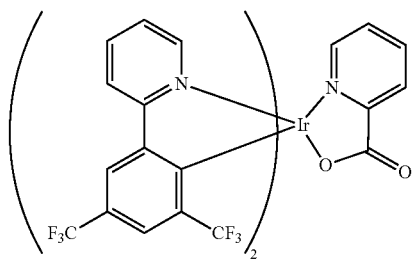

bis-{2-[3,5-bis(trifluoromethyl)phenyl]pyridinato-N,C2'}iridium(III)-picolinate (Ir(CF₃ppy)₂(Pic)

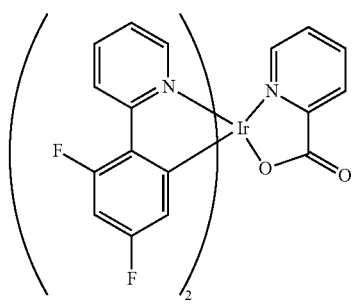

bis(2-[4,6-difluorophenyl]pyridinato-N,C2')iridium (III) picolinate [FIrPic]

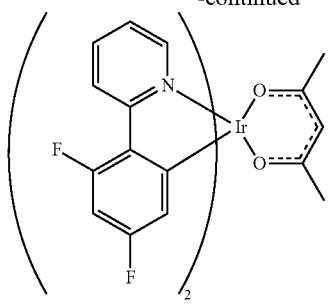

bis(2-[4,6-difluorophenyl]pyridinato-
N,C2')iridium(acetylacetonate) [FIr(acac)]

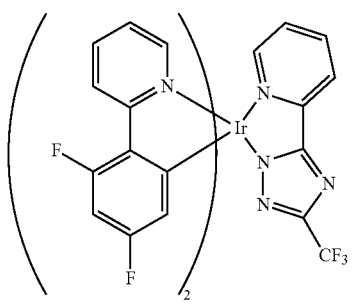

Iridium (III) bis(4,6-
difluorophenylpyridinato)-
3-(trifluoromethyl)-5-(pyridine-2-yl)-
1,2,4-triazolate (FIrtaz)

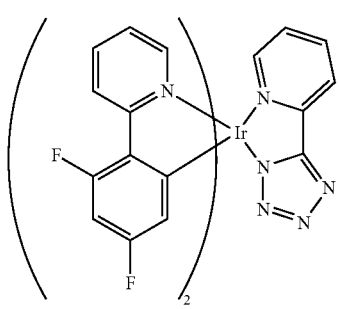

Iridium (III) bis(4,6-
difluorophenylpyridinato)-5-
(pyridine-2-yl)-1H-tetrazolate (FIrN4)

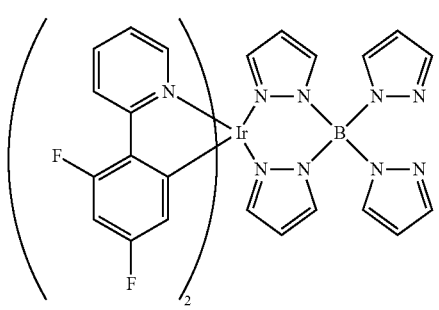

bis[2-(4,6-difluorophenyl)pyridinato-
N,C2']iridium(III)tetra(1-pyrazolyl)borate (Fir6)

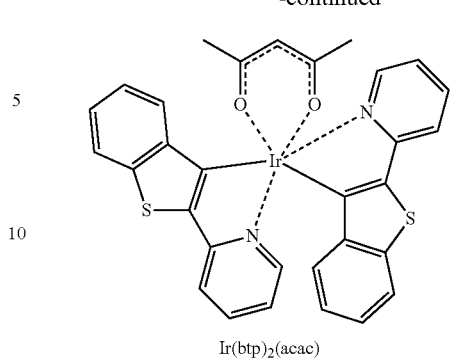

Ir(btp)$_2$(acac)

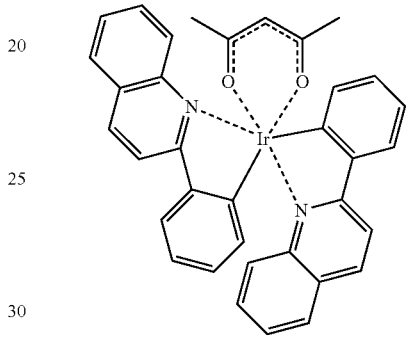

Ir(pq)$_2$(acac)

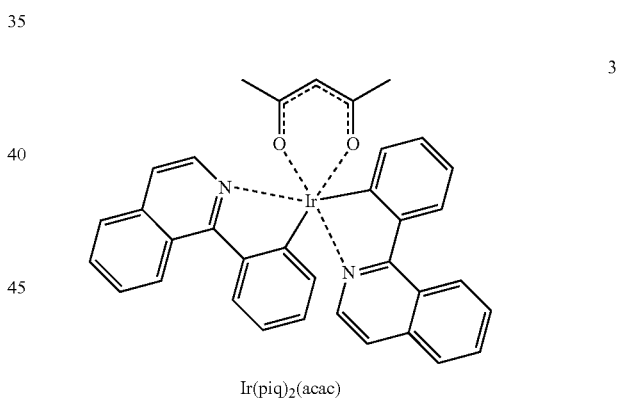

Ir(piq)$_2$(acac)

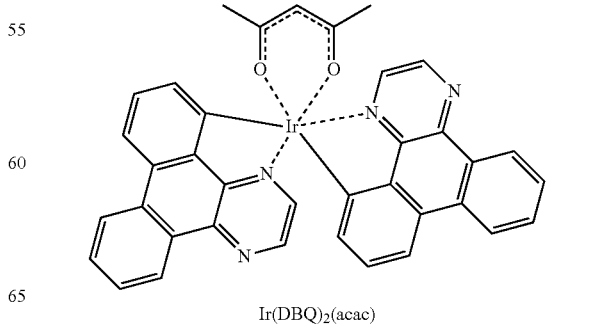

Ir(DBQ)$_2$(acac)

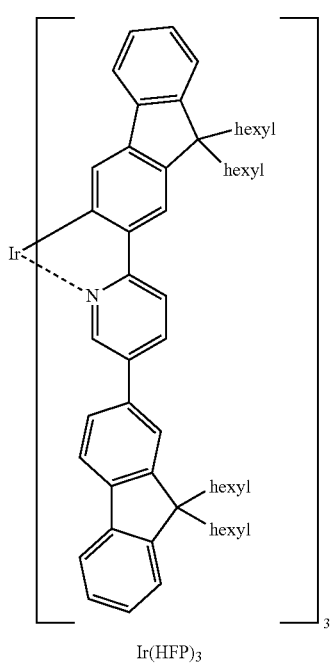

Ir(HFP)₃

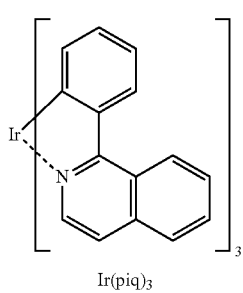

Ir(piq)₃

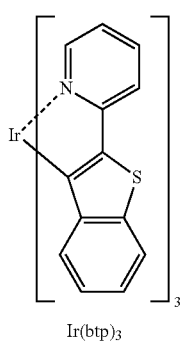

Ir(btp)₃

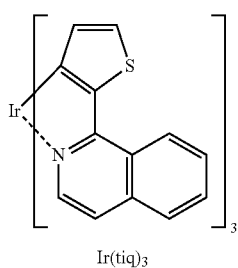

Ir(tiq)₃

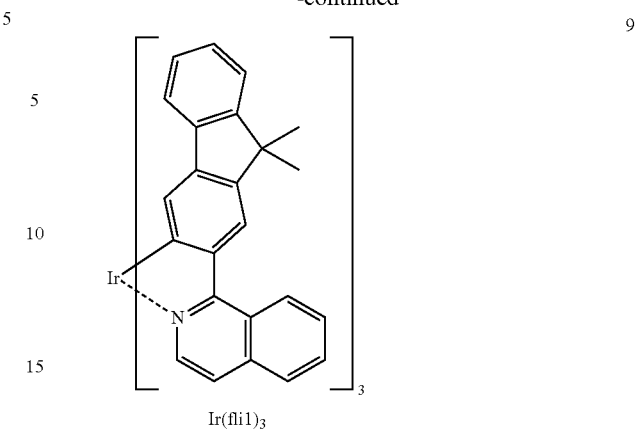

Ir(fli1)₃

1. (Btp)₂Ir(III)(acac); bis[2-(2′-benzothienyl)-pyridinato-N,C3′] iridium (III)(acetylacetonate)
2. (Pq)₂Ir(III)(acac); bis[(2-phenylquinolyl)-N, C2′]iridium (III) (acetylacetonate)
3. (Piq)₂Ir(III)(acac); bis[(1-phenylisoquinolinato-N,C2′)]iridium (III) (acetylacetonate)
4. (DBQ)₂Ir(acac); bis[(dibenzo[f, h]quinoxalino-N,C2′)]iridium (III)(acetylacetonate)
5. [Ir(HFP)₃], tris(2,5-bis-2′-(9′,9′-dihexylfluorene)pyridine)iridium (III)
6. Ir(piq)₃; tris[1-phenylisoquinolinato-N,C2′]iridium (III)
7. Ir(btp)₃; tris-[2-(2′-benzothienyl)-pyridinato-N,C3′] iridium (III)
8. Ir(tiq)₃, tris[1-thiophen-2-ylisoquinolinato-N,C3′]iridium (III)
9. Ir(fliq)₃; tris[1-9,9-dimethyl-9H-fluoren-2-yl)isoquinolinato-(N,C3′)iridium (III))

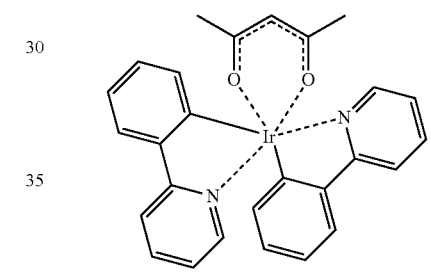

Ir(ppy)₂(acac)

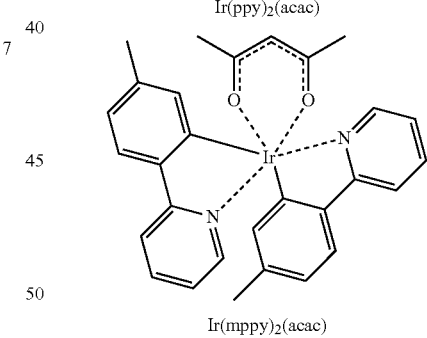

Ir(mppy)₂(acac)

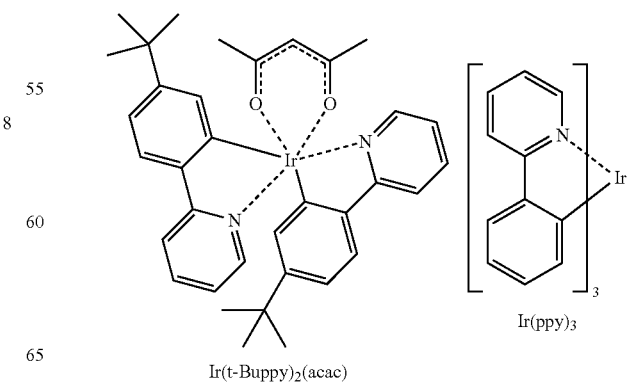

Ir(t-Buppy)₂(acac)　　Ir(ppy)₃

-continued

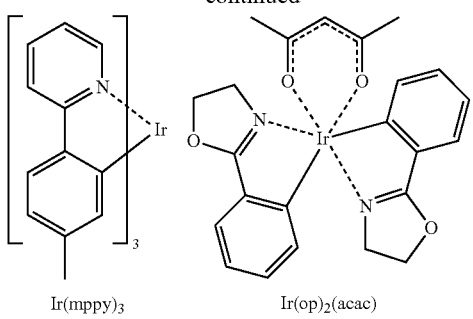

Ir(mppy)₃            Ir(op)₂(acac)

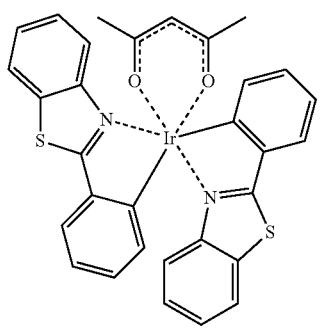

(bt)₂Ir(III)(acac)
bis[2-
phenylbenzothiazolato-
N,C2'] iridium
(III)(acetylacetonate)

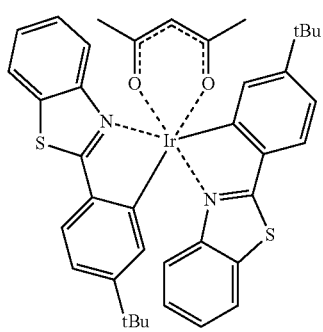

(t-bt)₂Ir(III)(acac)
bis[2-(4-tert-
butylphenyl)benzothiazolato-
N,C2']iridium(III)(acetylacetonate)

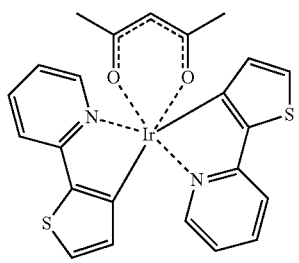

(thp)₂Ir(III)(acac)
bis[(2-(2'-thienyl)pyridinato-
N,C3')]iridium (III)
(acetylacetonate)

-continued

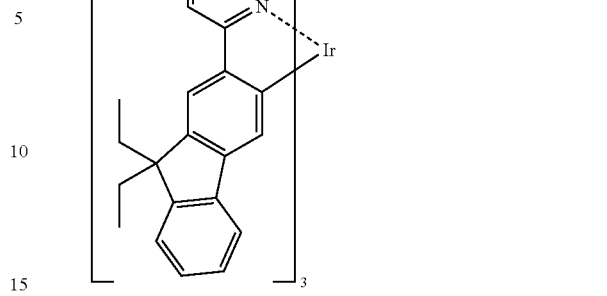

[Ir(Flpy)₃]
tris[2-(9,9-dimethylfluoren-2-
yl)pyridinato-(N,C3')]iridium
(III)

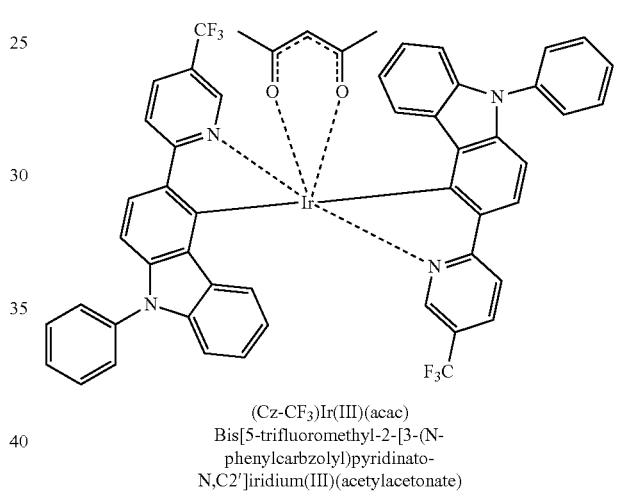

(Cz-CF₃)Ir(III)(acac)
Bis[5-trifluoromethyl-2-[3-(N-
phenylcarbzolyl)pyridinato-
N,C2']iridium(III)(acetylacetonate)

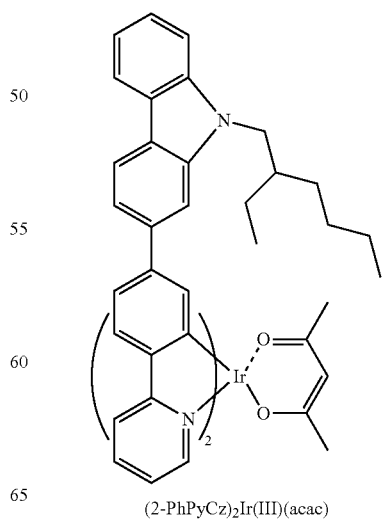

(2-PhPyCz)₂Ir(III)(acac)

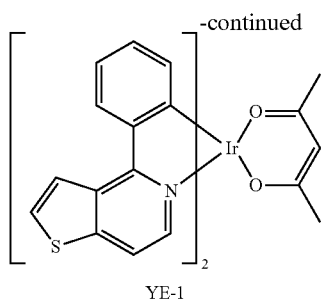

YE-1

The thickness of a light-emitting layer may vary. In one embodiment, a light-emitting layer has a thickness in the range of from about 1 nm to about 200 nm, 5 nm to about 150 nm, about 10 nm to about 50 nm, or about 20 nm or about 30 nm.

An optional transitional layer, e.g. transitional layer 60, may comprise a mixture of nanostructure material and charge-transport material, such as a hole-transport material or an electron-transport material. Generally, the character of the charge-transport material depends upon the position of the transitional layer. For example, a transitional layer disposed between a light-emitting layer and a hole-transport layer may comprise a mixture of a hole-transport material and a nanostructure material; and/or a transitional layer disposed between a light-emitting layer and an electron-transport layer may comprise a mixture of an electron-transport material and a nanostructure material. A nanostructure material may have charge-transport properties similar to those of the material with which it is mixed. For example, a nanostructure material with hole-transport properties may be mixed with a hole-transport material in a transitional layer; and/or a nanostructure material with electron-transport properties may be mixed with an electron-transport material in a transitional layer.

The thickness of a transitional layer may vary. In some embodiments, a transitional layer may have a thickness of about 1 nm to about 50 nm, about 5 nm to about 30 nm, or about 8 nm to about 15 nm. In some embodiments, a transition layer is not present.

In a transitional layer, the weight ratio of nanostructure material to charge-transport material may vary, such as about 10:1 to about 1:10, about 1.2:1 to about 1:1.2, or 1:1 to about 1:10, or any ratio in a range bounded by, or between, any of these values.

If present, a hole-transport layer, e.g. hole-transport layer 15, may be disposed between the anode and the light-emitting layer. A hole-transport layer may comprise at least one hole-transport material. Hole-transport materials may include, but are not limited to an optionally substituted compound such as an aromatic-substituted amine, a carbazole, a polyvinylcarbazole (PVK), e.g. poly(9-vinylcarbazole); polyfluorene; a polyfluorene copolymer; poly(9,9-di-n-octylfluorene-alt-benzothiadiazole); poly(paraphenylene); poly[2-(5-cyano-5-methylhexyloxy)-1,4-phenylene]; a benzidine; a phenylenediamine; a phthalocyanine metal complex; a polyacetylene; a polythiophene; a triphenylamine; an oxadiazole; copper phthalocyanine; 1,1-bis(4-bis(4-methylphenyl) aminophenyl)cyclohexane; 2,9-dimethyl-4,7-diphenyl-1,10-phenanthroline; 3,5-bis(4-tert-butyl-phenyl)-4-phenyl[1,2,4]triazole; 3,4,5-triphenyl-1,2,3-triazole; 4,4',4'-tris(3-methylphenylphenylamino)triphenylamine (MTDATA); N,N'-bis(3-methylphenyl)N,N'-diphenyl-[1,1'-biphenyl]-4,4'-diamine (TPD); 4,4'-bis[N-(naphthyl)-N-phenyl-amino] biphenyl (α-NPD); 4,4',4"-tris(carbazol-9-yl)-triphenylamine (TCTA); 4,4'-bis[N,N'-(3-tolyl)amino]-3,3'-dimethylbiphenyl (HMTPD); 4,4'-N,N'-dicarbazole-biphenyl (CBP); 1,3-N,N-dicarbazole-benzene (mCP); bis [4-(p,p'-ditolyl-amino)phenyl]diphenylsilane (DTASi); 2,2'-bis(4-carbazolylphenyl)-1,1'-biphenyl (4CzPBP); N,N'N"-1,3,5-tricarbazoloylbenzene (tCP); N,N'-bis(4-butylphenyl)-N,N'-bis(phenyl)benzidine; N,N'-Di(naphthalene-1-yl)-N,N'-diphenyl-benzidine (NPB) or the like.

If present, an electron-transport layer, e.g. electron-transport layer 30, may be disposed between the cathode and the light-emitting layer. Examples of electron-transport materials may include, but are not limited to optionally substituted compounds such as, 2-(4-biphenylyl)-5-(4-tert-butylphenyl)-1,3,4-oxadiazole (PBD); 1,3-bis(N,N-t-butyl-phenyl)-1,3,4-oxadiazole (OXD-7), 1,3-bis[2-(2,2'-bipyridine-6-yl)-1,3,4-oxadiazo-5-yl]benzene; 3-phenyl-4-(1'-naphthyl)-5-phenyl-1,2,4-triazole (TAZ); 2,9-dimethyl-4,7-diphenyl-phenanthroline (bathocuproine or BCP); aluminum tris(8-hydroxyquinolate) (Alq3); and 1,3,5-tris(2-N-phenylbenzimidazolyl)benzene; 1,3-bis[2-(2,2'-bipyridine-6-yl)-1,3,4-oxadiazo-5-yl]benzene (BPY-OXD); 3-phenyl-4-(1'-naphthyl)-5-phenyl-1,2,4-triazole (TAZ), 2,9-dimethyl-4,7-diphenyl-phenanthroline (bathocuproine or BCP); and 1,3,5-tris[2-N-phenylbenzimidazol-z-yl]benzene (TPBI). In one embodiment, the electron-transport layer is aluminum quinolate ($Alq_3$), 2-(4-biphenylyl)-5-(4-tert-butylphenyl)-1,3,4-oxadiazole (PBD), phenanthroline, quinoxaline, 1,3,5-tris[N-phenylbenzimidazol-z-yl]benzene (TPBI), or a derivative or a combination thereof.

The thickness of an electron-transport layer may vary. For example, some electron-transport layers may have a thickness of about 5 nm to about 200 nm, about 10 nm to about 80 nm, or about 20 nm to about 40 nm.

If desired, additional layers may be included in a light-emitting device, such as an electron injecting layer (EIL), a hole-blocking layer (HBL), an exciton-blocking layer (EBL), a hole-injecting layer (HIL), etc. In addition to separate layers, some of these materials may be combined into a single layer.

If present, an electron-injecting layer may be between a cathode layer and a light-emitting layer. Examples of suitable material(s) that can be included in the electron injecting layer include but are not limited to, an optionally substituted compound selected from the following: aluminum quinolate ($Alq_3$), 2-(4-biphenylyl)-5-(4-tert-butylphenyl)-1,3,4-oxadiazole (PBD), phenanthroline, quinoxaline, 1,3,5-tris[N-phenylbenzimidazol-z-yl]benzene (TPBI) a triazine, a metal chelate of 8-hydroxyquinoline such as tris(8-hydroxyquinoliate) aluminum, and a metal thioxinoid compound such as bis(8-quinolinethiolato) zinc. In one embodiment, the electron injecting layer is aluminum quinolate ($Alq_3$), 2-(4-biphenylyl)-5-(4-tert-butylphenyl)-1,3,4-oxadiazole (PBD), phenanthroline, quinoxaline, 1,3,5-tris[N-phenylbenzimidazol-z-yl]benzene (TPBI), or a derivative or a combination thereof.

If present, a hole-blocking layer may be between a cathode and a light-emitting layer. Examples of suitable hole-blocking material(s) include but are not limited to, an optionally substituted compound selected from the following: bathocuproine (BCP), 3,4,5-triphenyl-1,2,4-triazole, 3,5-bis(4-tert-butyl-phenyl)-4-phenyl-[1,2,4]triazole, 2,9-dimethyl-4,7-diphenyl-1,10-phenanthroline, and 1,1-bis(4-bis(4-methylphenyl)aminophenyl)-cyclohexane.

In some embodiments, a light-emitting device can include an exciton-blocking layer. In an embodiment, the band gap of the material(s) that comprise exciton-blocking layer is large enough to substantially prevent the diffusion of excitons. A number of suitable exciton-blocking materials that can be included in the exciton-blocking layer are known to those skilled in the art. Examples of material(s) that can compose an exciton-blocking layer include an optionally substituted compound selected from the following: aluminum quinolate ($Alq_3$), 4,4'-bis[N-(naphthyl)-N-phenyl-amino]biphenyl (α-NPD), 4,4'-N,N'-dicarbazole-biphenyl (CBP), and bathocuproine (BCP), and any other material(s) that have a large enough band gap to substantially prevent the diffusion of excitons.

If present, a hole-injecting layer may be between the light-emitting layer and the anode. Examples of suitable hole-injecting material(s) include, but are not limited to, an optionally substituted compound selected from the following: a polythiophene derivative such as poly(3,4-ethylenedioxythiophene (PEDOT)/polystyrene sulphonic acid (PSS), a benzidine derivative such as N,N,N',N'-tetraphenylbenzidine, poly(N,N'-bis(4-butylphenyl)-N,N'-bis(phenyl)benzidine), a triphenylamine or phenylenediamine derivative such as N,N'-bis(4-methylphenyl)-N,N'-bis(phenyl)-1,4-phenylenediamine, 4,4',4''-tris(N-(naphthylen-2-yl)-N-phenylamino)triphenylamine, an oxadiazole derivative such as 1,3-bis(5-(4-diphenylamino)phenyl-1,3,4-oxadiazol-2-yl) benzene, a polyacetylene derivative such as poly(1,2-bis-benzylthio-acetylene), and a phthalocyanine metal complex derivative such as phthalocyanine copper.

If present, in some embodiments, a light-extracting material, such as light-extracting material 200 may be a light-extraction film. The light-extracting material 200 may be disposed on: the anode, the cathode, a transparent layer disposed between the anode and the light-extraction material, and/or a transparent layer disposed between the cathode and the light extraction material. A light-extracting material may comprise any nanostructure material described above, and may comprise any nanostructure as described above, as well as nanostructures or microstructures of a larger size. For example, nanostructures may have: an average x dimension of about 400 nm, about 500 nm, about 1000 nm, about 1500 nm, about 2000 nm, about 2500 nm, about 3000 nm, or any value in a range bounded by, or between, any of these lengths; an average y dimension of about 50 nm, about 100 nm, about 300 nm, about 500 nm, about 700 nm, about 1000 nm, about 1200 nm, about 1500 nm, about 1800 nm, about 2000 nm, or any value in a range bounded by, or between, any of these lengths; and/or an average z dimension of about 10 nm, about 30 nm, about 50 nm, about 70 nm, about 90 nm, about 100 nm, or any value in a range bounded by, or between, any of these lengths. In some embodiments, at least one particle in the film, or average of the particles in the film, may have an x dimension, a y dimension, or a z dimension of: about 5 nm, about 0.01 µm, about 0.02 µm, about 0.05 µm, about 0.1 µm, about 0.5 µm, about 1 µm, about 2 µm, about 5 µm, about 10 µm, about 20 µm, about 50 µm, about 100 µm, about 150 µm, about 200 µm, about 500 µm, about 1000 µm, or any length bounded by, or between, any of these values.

In some embodiments, a light-extracting material may comprise a regular, quasi-regular, or random nanostructures formed within or on the surface of a light-extracting layer or as a separate optional layer of material having such nanostructures formed within a surface of such a layer. Suitable examples, include, but are not limited to, prismatic surfaced layers as described in U.S. Pat. Nos. 7,957,621; 7,799,416; 6,707,611; and 6,354,709, which are incorporated by reference herein for their description of brightness enhancing films, e.g., those sold under the brand name Vikuti by 3M (Minneapolis, Minn.). Another suitable example are light-extracting materials including layers comprising a transparent or translucent material having a periodic pattern formed on the surface thereof. One suitable example is the microlense array (MLA) of periodic or repeating pattern of spherical or trapezoidal shapes formed within a surface of a transparent or translucent material. Suitable examples include, but are not limited to U.S. Pat. Nos. 6,594,079 and 7,864,450, which are incorporated by reference herein for their description of microlens arrays or bubble array layers.

The thickness of a light-extracting material may vary. In some embodiments, a light-extracting material may have a thickness in the nanometer to micron range. For example, the thickness of the material may be about 5 µm to about 100 µm, about 0.1 µm to about 100 µm, about 500 nm, about 0.1 µm, about 1 µm, about 1.3 µm, about 3 µm, or about 4 µm, about 5 µm, about 7 µm, about 10 µm, about 20 µm, about 100 µm, or any thickness in a range bounded by, or between, any of these values.

A layer of light-extracting material may comprise a number of pores or voids. For example, a layer of light-extracting material may comprises a plurality of voids having a total volume that may be about 50% to about 99%, about 50% to about 90%, 50%, about 70%, about 80%; about 85%, about 90%, about 95%, or about 99% of the volume of the film, or any percentage of total volume in a range bounded by, or between, any of these values.

In some embodiments, a layer of light-extracting material may comprise a plurality of voids of a number and size such that the film may have a thickness that is about 2 times to about 100 times, about 10 times to about 50 times, about 2 times, about 10 times, up to about 50 times, or 100 times, that of the thickness of a film of the same material which has no voids, or any thickness ratio in a range bounded by, or between, any of these values. For example, a film may have a thickness of about 5 µm when a film of the same material would have a thickness of 800 nm if the film had no voids.

The size of the voids may vary. The dimensions of a void may be quantified in a manner analogous to that described above for a nanostructure. In some embodiments, at least about 10% of the voids have a largest dimension, or an x dimension, of about 0.5 µm to about 5 µm, about 1 µm to about 4 µm, about 0.5 µm, about 1 µm, about 2 µm, about 3 µm, about 4 µm, about 5 µm, or any length in a range bounded by, or between, any of these values. In some embodiments, at least one void in the film, or average of the voids in the film, may have an x dimension, a y dimension, or a z dimension of: about 5 µm to about 1000 µm, about 5 µm to about 2 µm, about 5 nm, about 0.01 µm, about 0.02 µm, about 0.05 µm, about 0.1 µm, about 0.5 µm, about 1 µm, about 2 µm, about 5 µm, about 10 µm, about 20 µm, about 50 µm, about 100 µm, about 150 µm, about 200 µm, about 500 µm, about 1000 µm, or any length bounded by, or between, any of these values.

The density of light-extracting materials may vary, and may be affected by the voids, the material, and other factors. In some embodiments, the density of the film including the voids may be about 0.005 picograms/µm$^3$ to about 0.9 picograms/µm$^3$, about 0.05 picograms/µm$^3$ to about 0.7 picograms/µm$^3$, about 0.005 picograms/µm$^3$, about 0.05 picograms/µm$^3$, about 0.1 picograms/µm$^3$, about 0.3 picograms/µm$^3$, 0.5 picograms/µm$^3$, about 0.7 picograms/µm$^3$, about 0.9 picograms/µm$^3$, or any density in a range bounded by, or between, any of these values.

The refractive index of a light-extracting material may vary. For example, the refractive index may be about 1.1 to about 1.8, about 1.5 to about 1.8, about 1.1, about 1.5, about 1.7, about 1.8, or any refractive index in a range bounded by, or between, any of these values. In some embodiments, the refractive index of the material of the light-extracting layer may be greater than or equal to that of the substrate.

Additionally, inclusion of a light-extracting material may increase luminous efficiency or power efficiency of an OLED, as compared to a similar device without the nanostructure material (e.g. as illustrated in Tables 1-5), by about 1% to about 50%; about 2% to about 40%; about 10% to about 30%; about 2%, such as 2.22%; about 4%, such as 4.17%; about 11%, such as 10.75%; about 12%, such as 12.16%; about 25%, such as 23.8%; about 30%, such as 28.2%, 27.5%, or 30.61%; about 25%, such as 26.32%; or any increase in a range bounded by, or between, any of these values.

In some embodiments, the combination of a light-extracting layer, or a layer of light-extracting material, and a nanostructure material may be synergistic. For example dispersion in an OLED may increase the light output more than the summed increase light output of an OLED with only an extraction layer and one with only nanostructures. This principle is illustrated in Table A.

TABLE A

Synergistic light output

| Device | Increase in light output or efficiency over OLED X only |
|---|---|
| OLED X | — |
| OLED X + nanostructure | A |
| OLED X + light-extracting material | B |
| OLED X + nanostructure + light-extracting material | C |

Synergism: C > A + B

For example, if a nanostructure material is added to OLED X, the light output, power efficiency, luminous efficiency, or the like, may be increased by an amount A.

If a light-extracting material is added to OLED X, the light output, power efficiency, luminous efficiency, or the like, may be increased by an amount B. If both a nanostructure material and a light-extracting material are added to OLED X, a performance parameter such as light output, power efficiency, luminous efficiency, or the like, may be increased by an amount C.

If the combination of a light-extracting material and a nanostructure material in an OLED synergistically increases a device's performance parameters such as light output, luminous efficiency, or power efficiency, C will be greater than A+B. Synergistic increase may be quantified as a percentage, e.g.:

$$\text{Synergistic increase} = [100 \times (C - A - B)]/(A+B)$$

For example, if A is 10%, B is 10%, and C is 25%, then the Synergistic increase is 25% (100×5/20).

In some embodiments, the synergistic increase is about 15% to about 60%, about 15% to about 50%, about 20% to about 25%, about 17%, about 20%, about 23%, about 24%, about 25%, about 50%, or any synergistic increase in a range bounded by, or between, any of these values.

In some embodiments, the combination of a light-extracting layer and a nanostructure material in an OLED may increase the light output by about 70% or more. Light-emitting devices comprising a subject compound can be fabricated using techniques known in the art, as informed by the guidance provided herein.

The following embodiments are contemplated:

Embodiment 1. A light-emitting device comprising:
　an light-emitting layer disposed between an anode and a cathode;
　a first charge-transport layer comprising a first charge-transport material, and disposed between the light-emitting layer and the anode or the cathode; and
　a nanostructure material disposed between, or in contact with, the first charge-transport layer and the light-emitting layer.

Embodiment 2. The light-emitting device of embodiment 1, wherein light emitted from the device passes through the first charge-transport layer.

Embodiment 3. The light-emitting device of embodiment 1, wherein the first charge-transport layer is an electron-transport layer disposed between the light-emitting layer and the cathode.

Embodiment 4. The light-emitting device of embodiment 2, further comprising a hole-transport layer disposed between the light-emitting layer and the anode.

Embodiment 5. The light-emitting device of embodiment 1, wherein the first charge-transport layer is a hole-transport layer disposed between the light-emitting layer and the anode.

Embodiment 6. The light-emitting device of embodiment 5, further comprising an electron-transport layer disposed between the light-emitting layer and the cathode.

Embodiment 7. The light-emitting device of any one of the preceding embodiments, wherein the nanostructure material is in the form of nanostructures that substantially penetrate or deform a layer that the nanostructure contacts.

Embodiment 8. The light-emitting device of any one of the preceding embodiments, wherein at least a portion of the nanostructure material comprises a plurality of nanostructures disposed on a surface of the light-emitting layer nearest the first charge-transport layer.

Embodiment 9. The light-emitting device of any one of the preceding embodiments, wherein at least a portion of the nanostructure material is in a transitional layer comprising a mixture of the first charge-transport material and the nanostructure material, and disposed between the light-emitting layer and the first charge-transport layer.

Embodiment 10. The light-emitting device of any one of the preceding embodiments, wherein the nanostructure material comprises an organic compound.

Embodiment 11. The light-emitting device of embodiment 10, wherein the organic compound has a stable planar conformation.

Embodiment 12. The light-emitting device of embodiment 10, wherein the organic compound comprises an optionally substituted aromatic or heteroaromatic ring or ring system.

Embodiment 13. The light-emitting device of embodiment 10, wherein the organic compound is:

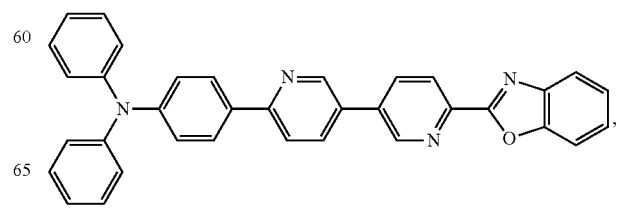

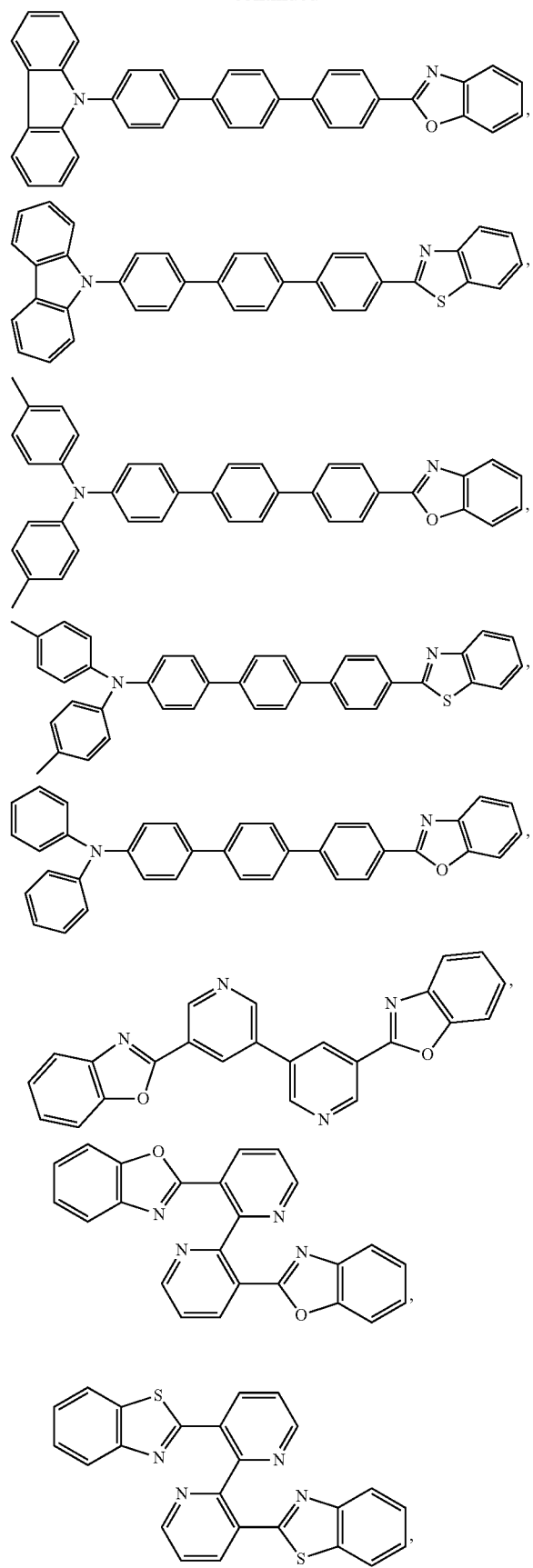
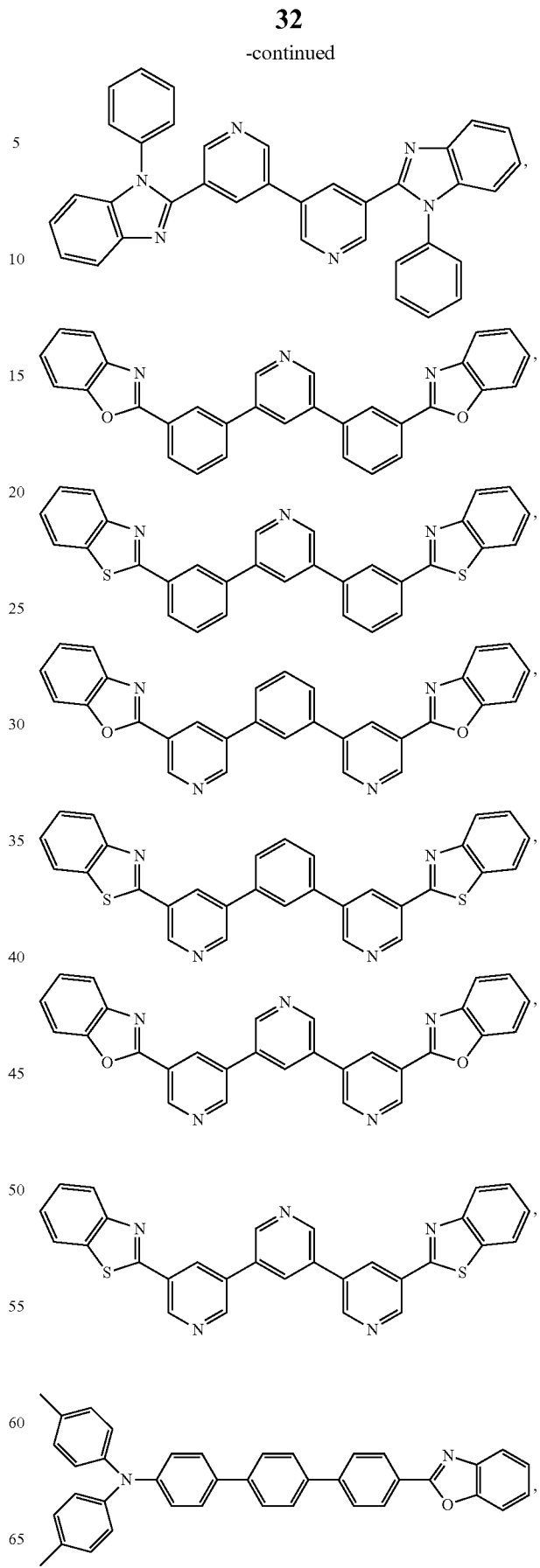

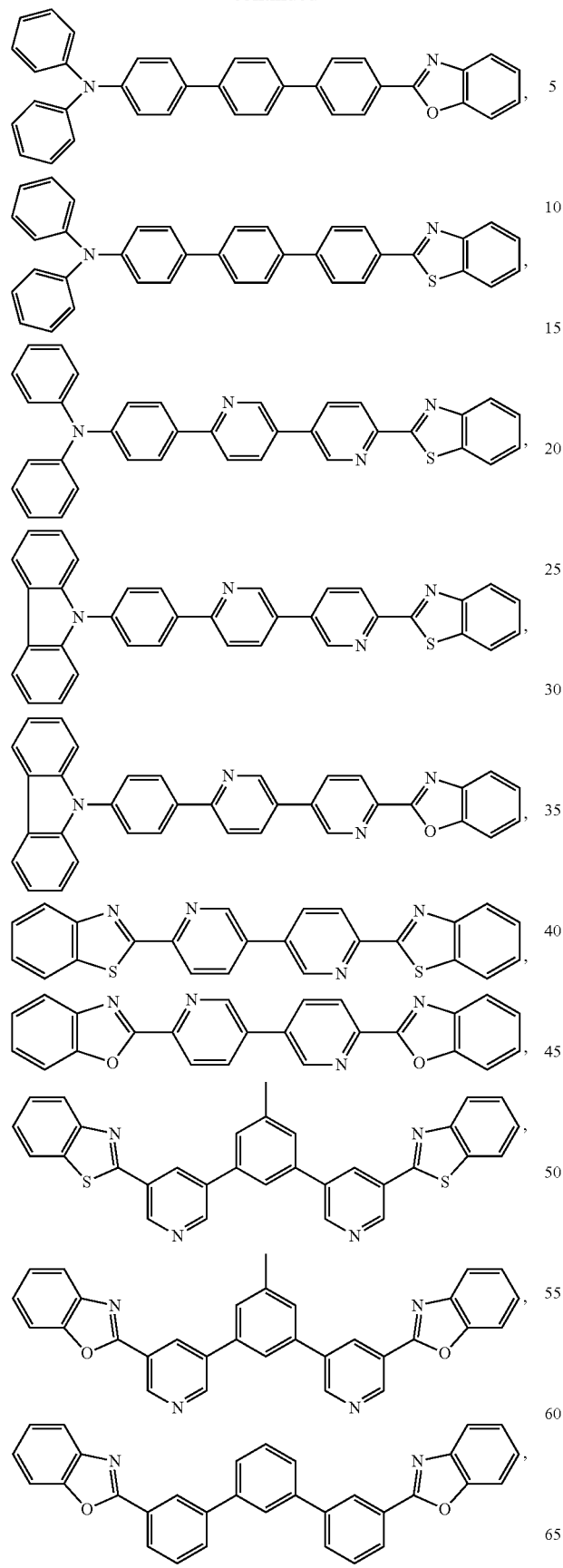

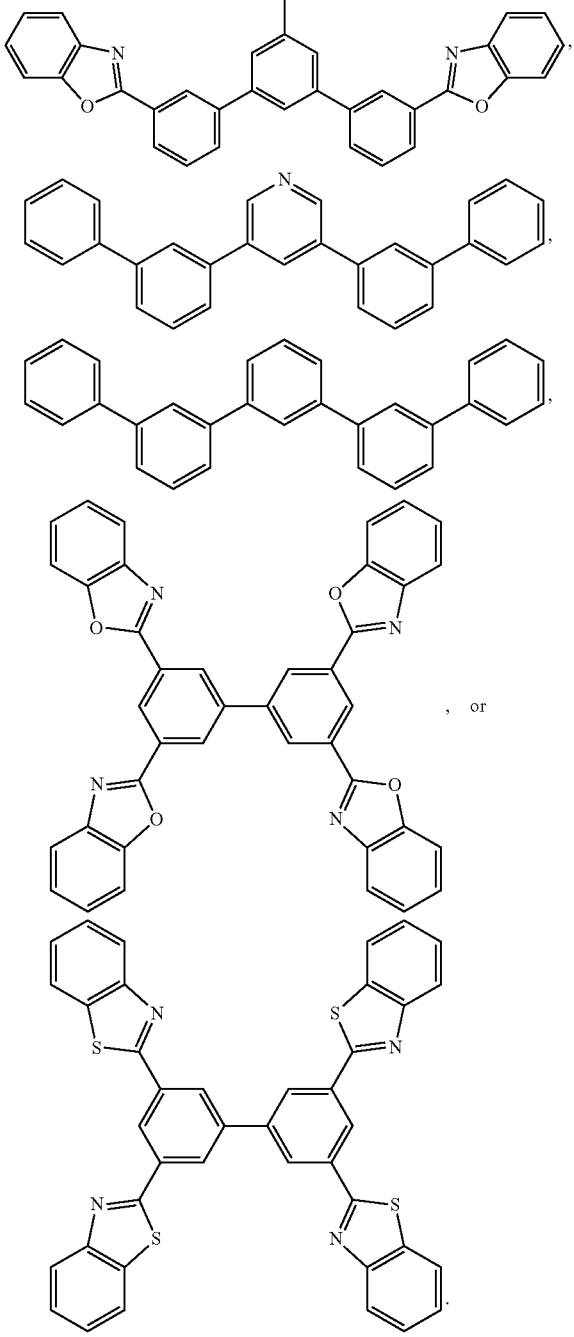

Embodiment 14. The light-emitting device of embodiment 1, further comprising a light-extracting material.

Embodiment 15. The light-emitting device of any of the preceding embodiments, wherein the nanostructure material has a total mass of about 1 ng to about 500 ng for each $cm^2$ of area of the surface of the light-emitting layer.

Embodiment 16. The light-emitting device of embodiment 15, wherein the nanostructure material has a total mass of about 10 ng to about 100 ng for each $cm^2$ of area of the surface of the light-emitting layer.

Embodiment 17. The light-emitting device of embodiments 9-14, wherein the transitional layer has a weight ratio of nanostructure material to charge-transport material of about 1:1 to about 1:10.

Embodiment 18. The light-emitting device of any of the preceding embodiments, wherein the nanostructure material increases the device's luminous efficiency by at least about 5% as compared to a device that is identical except that it lacks the nanostructure material.

Embodiment 19. The light-emitting device of any one of the preceding embodiments, further comprising a light-extracting material disposed on: the anode, the cathode, a transparent layer disposed between the anode and the light-extracting layer, or a transparent layer disposed between the cathode and the light-extracting layer.

Embodiment 20. The light-emitting device of embodiment 19, wherein the light-extracting material increases the device's power efficiency by at least about 10% as compared to a device that is identical except that it lacks the light-extracting material.

Embodiment 21. The light-emitting device of embodiment 19, wherein the combination of the nanostructure material and the light-extracting material synergistically increases the device's luminous efficiency.

Embodiment 22. The light-emitting device of embodiment 21, wherein the combination of the nanostructure material and the light-extracting material synergistically increases the device's luminous efficiency by at least about 15%.

EXAMPLE 1A 3,5-Di[3-(benzoxazol-2-yl)phenyl]pyridine (IOC-1) was vapor deposited on a 30 nm-thick coating of Host-1 on a Si substrate at rates of 0.08 Å/s, 0.3 Å/s, and 0.5 Å/s. Vapor deposition was carried out using a glove-box hosted vacuum deposition system at a pressure of $10^{-7}$ torr (1 torr=about 130 Pa). FIG. 6A shows scanning electron microscope images of the surfaces having a nominal thickness of IOC-1 of 0.4 nm at deposition rates of 0.08 Å/s (FIG. 6A), 0.3 Å/s (FIG. 6B), and 0.5 Å/s (FIG. 6C).

EXAMPLE 1B

Additional surfaces (nominal thicknesses of about 10 Å) were constructed in a manner similar to that described in Example 1A, except that IOC-1 was deposited at a rate of 0.05 Å/s (FIG. 6D), 0.3 Å/s (FIG. 6E) and 1.0 Å/s (FIG. 6F). FIGS. 6D, 6E and 6F show scanning electron microscope images of the surfaces having nominal thicknesses and deposited at the described deposition rate. These scanning electron microscope images illustrate the nanostructures which can be described as fiber, needle, or capsule-shaped.

EXAMPLE 1C

Additional surfaces (nominal thicknesses of about 10 Å) were constructed in a manner similar to that described in Example 1A, except that IOC-2 layer of nominal thickness 10 Å (FIG. 6G) was deposited instead of IOC-1. FIG. 6G shows scanning electron microscope image of the surfaces having a nominal thickness of 5,5"-bis(benzoxazol-2-yl)-3,3':5',3"-terpyridine (IOC-2) of 10 angstroms (FIG. 6G) at a deposition rate of 0.5 Å/s. These scanning electron microscope images illustrate the nanostructures which can be described as fiber, needle or capsule-shaped.

EXAMPLE 1D

An additional surface (nominal thicknesses of about 10 Å) was constructed in a manner similar to that described in Example 1A, except that IOC-3 layer of nominal thickness 10 Å (FIGS. 6H and 6I) was deposited instead of IOC-1. FIGS. 6H and 6I show scanning electron microscope images of the surfaces having a nominal thickness of IOC-3 of 10 Å (FIGS. 6H and 6I respectively) at a deposition rate of 0.5 Å/s. These scanning electron microscope images illustrate the nanostructures which can be described as domed, circular, or hemispherical.

EXAMPLE 2

Figure 7A:
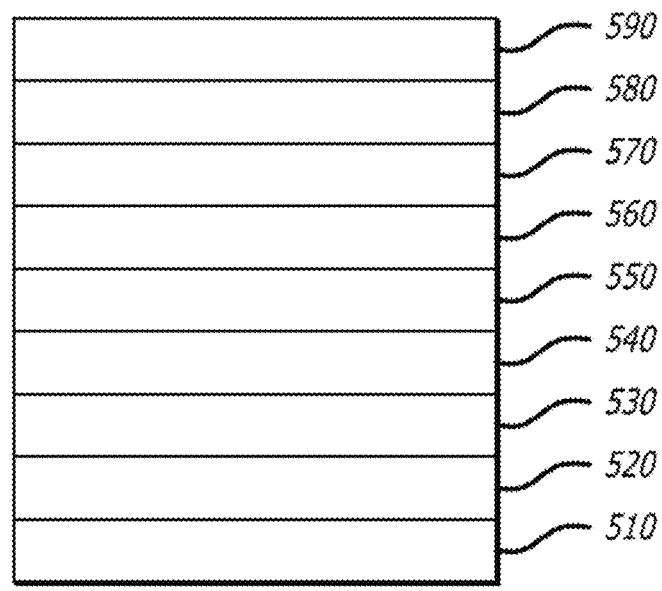
FIGS. 7A-7B are schematic depictions of embodiments of organic light-emitting devices.

Fabrication of a Light-Emitting Device with 0.4 Nm Thick Plurality of Nanostructures Deposition and a Control Device FIG. 7A depicts the structure of Device A that was prepared as follows: ITO anode 520 coated glass substrates 510 were cleaned by ultrasound in detergent, deionized water, acetone, and 2-propanol consecutively, then baked at 110° C. for 3 hours, followed by treatment with oxygen plasma for 30 min. A hole-injecting layer 530 of PEDOT: PSS (HIL 1.1 purchased from H. C. Starck) was spin-coated at 4000 rpm onto the pre-cleaned and $O_2$-plasma treated (ITO)-substrate and annealed at 180° C. for 10 min, yielding a thickness of around 40 nm. In a glove-box hosted vacuum deposition system at a pressure of $10^{-7}$ torr, a hole-transport layer 540 of NPB was first deposited on top of PEDOT/PSS layer at deposition rate of 0.1 nm/s, yielding a 40 nm thick film. A 20 nm-thick light-emitting layer 550 of Host-2 doped with 10 wt % red phosphorescent emitter Ir(piq)$_2$acac was deposited on top of hole-transport layer 540. Afterwards a 0.4 nm-thick deposit of a plurality of nanostructures 560 (measured by the Quartz sensor) of IOC-1 was deposited at deposition rate around 0.01 nm/s, followed by a transitional layer 570 of IOC-1 and TPBi co-deposited at 0.05 nm/s, respectively, with a thickness of 8 nm. Then a 32 nm thick electron-transport layer 580 of TPBi was deposited at 0.1 nm/s to keep the total thickness of electron-transport materials at about 40 nm. The device was completed by cathode 590, which comprised LiF (1 nm) and Al (100 nm) layers deposited (not depicted) successively at deposition rates of 0.015 nm/s and 0.3 nm/s, respectively.

For Control Device 1, ITO anode coated glass substrates were cleaned by ultrasound in detergent, deionized water, acetone, and 2-propanol consecutively, then baked at 110° C. for 3 hours, followed by treatment with $O_2$-plasma for 30 min. A hole-injecting layer of PEDOT: PSS (HIL 1.1 purchased from H. C. Starck) was spin-coated at 4000 rpm onto the pre-cleaned and $O_2$-plasma treated (ITO)-substrate and annealed at 180° C. for 10 min, yielding a thickness of around 40 nm. In a glove-box hosted vacuum deposition system at a pressure of $10^{-7}$ torr, a hole-transport layer of NPB was first deposited on top of PEDOT/PSS layer at deposition rate of 0.1 nm/s, yielding a 40 nm thick film. A 20 nm-thick light-emitting layer of HOST-2 doped with 10 wt % red phosphorescent emitter Ir(piq)$_2$acac was deposited on top of hole-transport layer. Then a 40 nm thick electron-transport layer of 1,3,5-tris(N-phenylbenzimidizol-2-yl)benzene (TPBI) was deposited at deposition rate around 0.1 nm/s. Then device was completed by a cathode, which comprised LiF (1 nm) and Al (100 nm) layers that were deposited successively at deposition rates of 0.015 nm/s and 0.3 nm/s, respectively. Each individual device had an area of 1.6 cm$^2$.

EXAMPLE 3

Performance of Device A

The current-voltage-brightness (I-V-L) characteristics and EL spectra of the devices were measured by a Keithley 2612A sourcemeter (Keithley Instruments, Inc., Cleveland, Ohio, USA) and a PhotoResearch PR-670 spectroradiometer (Photo Research, Inc., Chatsworth, Calif., USA) controlled by a homemade software. All device operation is carried out inside a nitrogen-filled glove-box.

Figure 8:
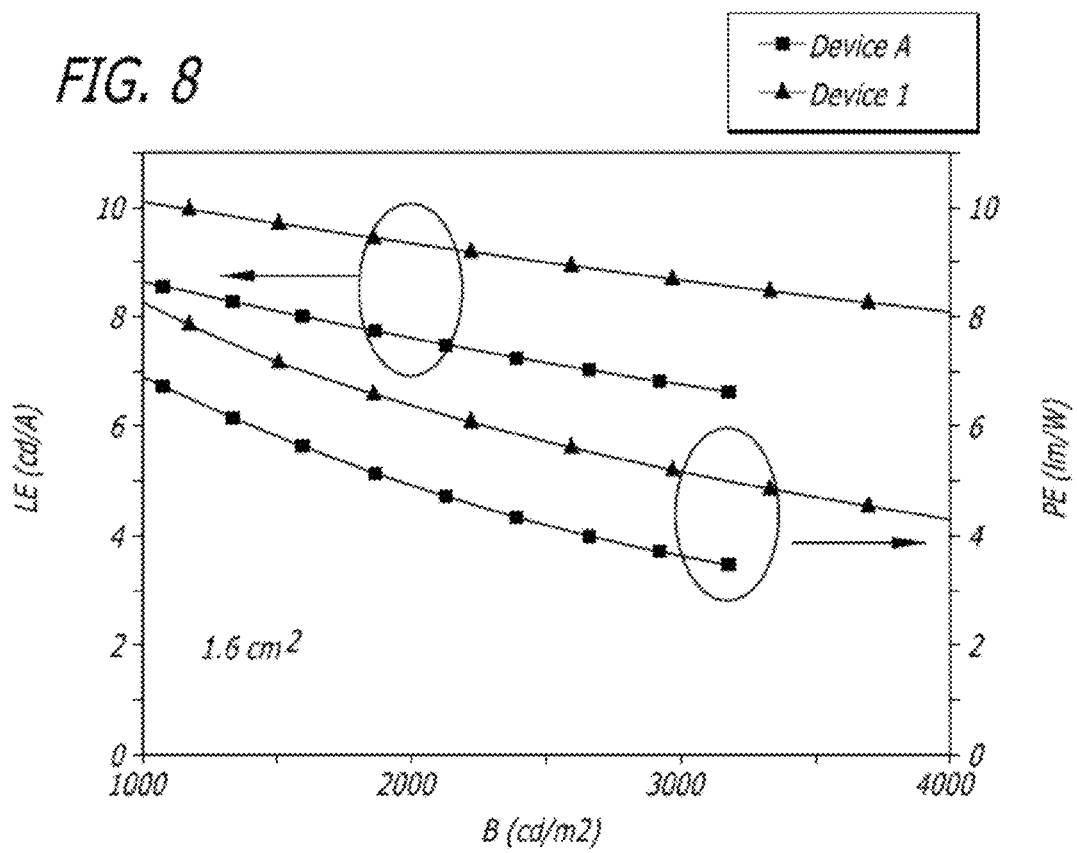
FIG. 8 is a plot of luminous efficiency and power efficiency against brightness for Device A (square data points) and Control Device 1 (triangle data points).

FIG. 8 is a plot of the luminous efficiency and the power efficiency against brightness for the devices of Example 2. Device A, which has a plurality of nanostructures and a transitional layer (shown with triangles) had a luminous efficiency that was 17.5% higher and a power efficiency that was 19% higher compared to the Control Device 1 (shown with squares).

EXAMPLE 4

Device A2 was prepared using the same fabrication procedure as Device A (FIG. 7A) except the thickness of plurality of nanoparticles 560 was 0.3 nm, the thickness of transitional layer 570 was 8 nm, and the thickness of electron-transport layer 580 was 35 nm. Device A3 was prepared to be the same as Device A2 except it had a light-extracting layer (Vikuiti brightness enhancement film II, 3M, St. Paul Minn.) deposited on the external surface of the glass substrate 510. Control Device 2 was the same as Control Device 1 except it had a light-extracting layer (Vikuiti brightness enhancement film II, 3M, St. Paul Minn.) deposited on the external surface of the glass substrate 510.

Figure 9:
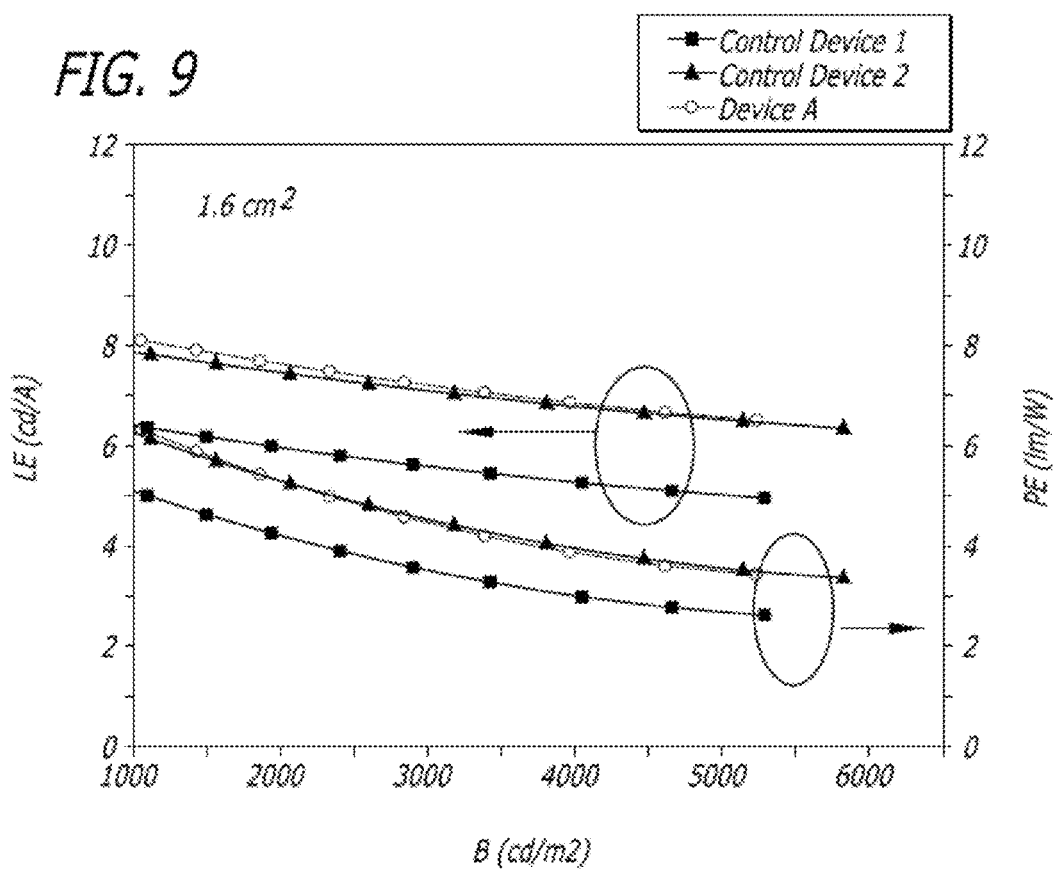
FIG. 9 is a plot of luminous efficiency and power efficiency of Device Control Device 1 (square data points); Control Device 2 (triangle data points); and Device A.
Figure 10:
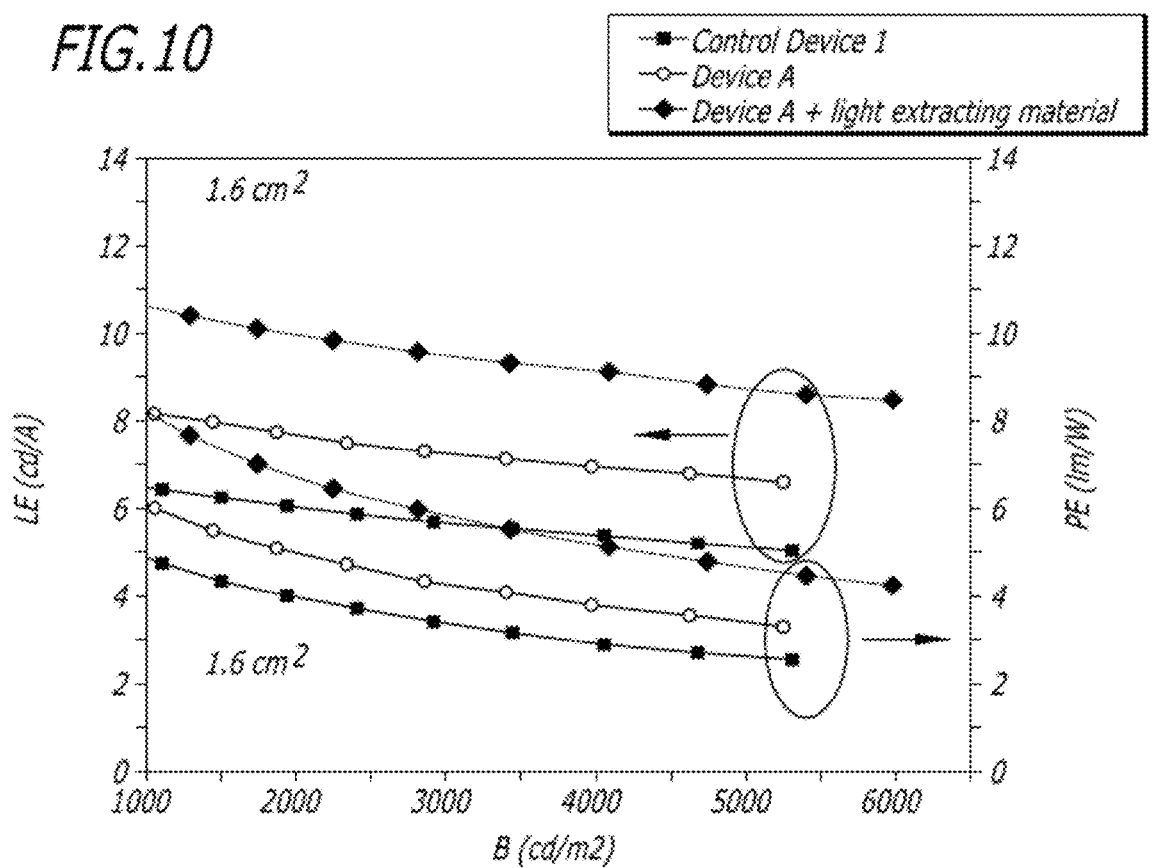
FIG. 10 is a plot of luminous efficiency and power efficiency of Control Device 1 (square data points), Device A (open circle data points), and Device A with optional light-extracting material (diamond data points).

FIG. 9 is a plot of the luminous efficiency and the power efficiency of Device Control Device 1 (square data points), Control Device 2 (triangle data points), and Device A2 (open circles). FIG. 10 is a plot of the luminous efficiency and the power efficiency of Control Device 1 (square data points), Device A2 (open circle data points), and Device A3 (diamond data points).

Device A2 had a luminous efficiency that was 28.2% higher, and a power efficiency that was 27.5% higher, than Control Device 1. Control Device 2 (Control Device 1 with brightness enhancing film) had a luminous efficiency that was 25% higher and a power efficiency that was 23.8% higher, than Control Device 1 (no enhancing layer/nanostructures). Device A3 had a luminous efficiency that was 69.3% higher and a power efficiency that was 70.8% higher, than Control Device 1. Device A3, with both nanoparticles and brightness enhancing layer) demonstrated more enhancement than with either the nanostructures or brightness enhancement layers separately or the sum of both embodiments individually. The results at 1000 cd/m$^2$ are summarized in Table 1.

TABLE 1

| Device | Device configuration | LE (cd/A) | PE (lm/W) | LE increase | PE increase |
|---|---|---|---|---|---|
| Control Device 1 | Control | 6.38 | 5.07 | — | — |
| Control Device 2 | Control + Light-extracting layer | 7.9 | 6.35 | 25% | 23.8% |
| Device A2 | Nanostructure | 8.14 | 6.5 | 28.2% | 27.5% |
| Device A3 | Nanostructure + Light-extracting layer | 10.8 | 8.66 | 69.3% | 70.8% |

EXAMPLE 5

Figure 12A:
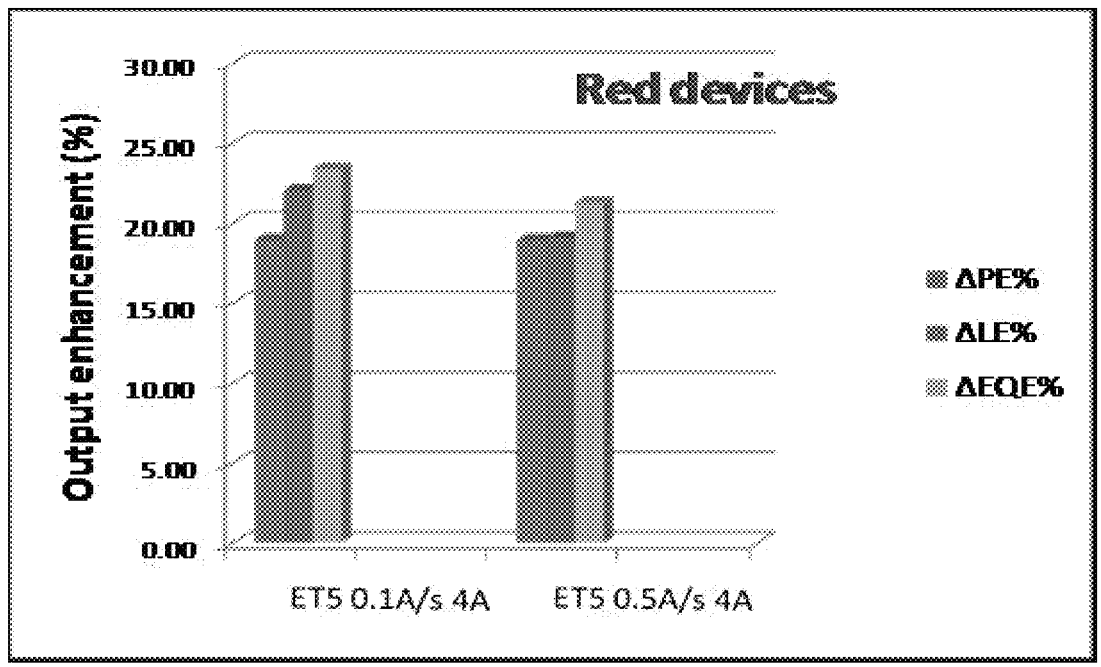
FIGS. 12A-C are plots that depict changes in luminescent efficiency, power efficiency and external quantum efficiency of Device B (Host-2 with varying dopants).
Figure 12B:
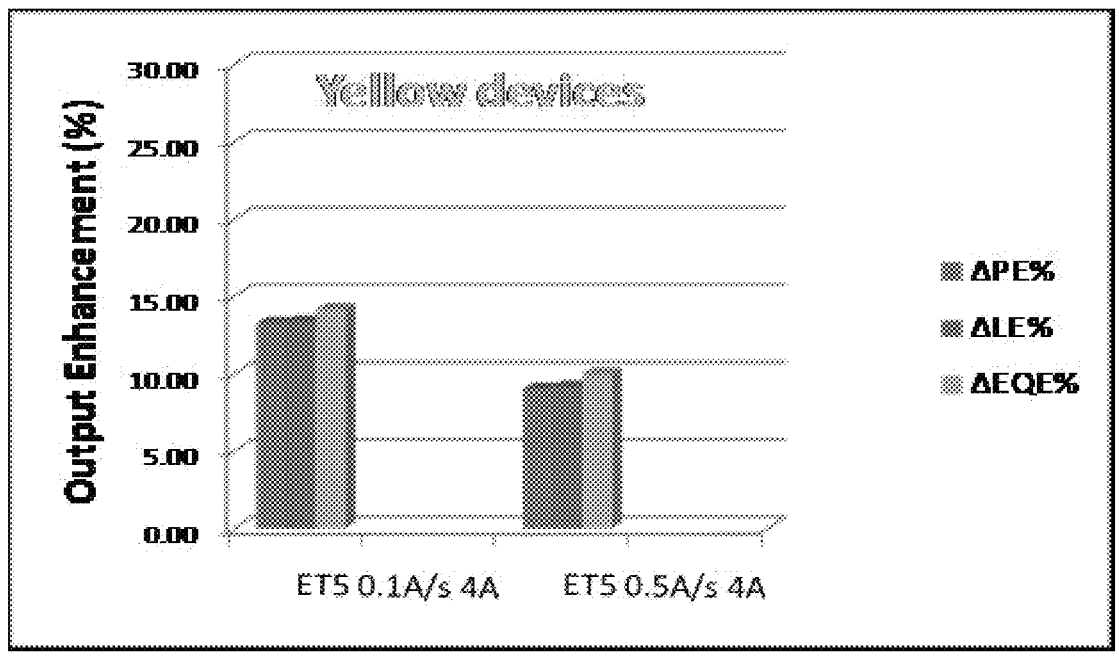
Figure 12C:
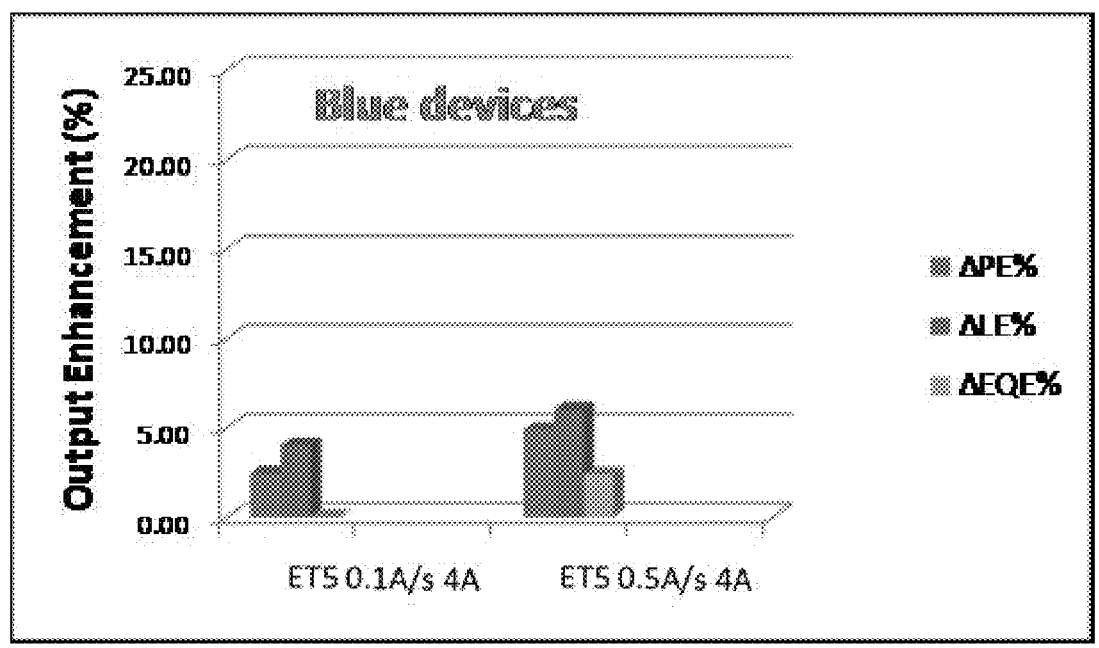

Devices G, I, and K were prepared using the same structure and fabrication procedure as Device A (FIG. 17A) except the thickness of the anode 520 was 110 nm, the thickness of the HTL 540 was 30 nm, the thickness of the light emissive layer 550 was 30 nm, there was no transitional layer 570, and the thickness of electron-transport layer 580 was 40 nm. Devices G, I and K differed from each other by the emissive material used in the emissive layer 550 (Device G [red emitting]: Host-2:Ir(piq)$_2$acac 10% Wt %; Device I [yellow emitting]: Host-2:YE-01 10% Wt; and Device K [blue emitting]: undoped Host –2). Additional Devices were made similar to Devices G, I and K, except that the rate of deposition was changed, in some cases 0.1A/sec and in some cases 0.5A/sec. The output enhancement for these devices are shown in FIGS. 12A-12C. Devices H, J and L were prepared to be the same as Devices G, I and K except that they had a microlens array film deposited on the external surface of the glass substrate 510. Control Devices 3, 5, and 7 were the same as Control Device 1 except the thickness of the anode 520 was 110 nm, the thickness of the hole-transport layer 540 (NPB) was 30 nm, the thickness of the light emissive layer 550 was 30 nm. Control devices 4, 6, and 8 were made in a similar manner as Control Devices 3, 5 and 7 except that they incorporated an additional light-extracting layer (hemispherical-type microlens array (MLA), with a hemisphere diameter of 5 um, height of 2.5 um and a period of 5 um) deposited on the exterior surface of the glass substrate 510).

The results at 1000 cd/m$^2$ are summarized in Tables 2, 3 and 4.

TABLE 2

(Red emitting)

| Device | Device configuration | LE (cd/A) | PE (lm/W) | LE increase | PE increase |
|---|---|---|---|---|---|
| Control Device 3 | Control | 9.3 | 7.4 | — | — |
| Control Device 4 | Control + Light-extracting layer | 10.3 | 8.3 | 10.75% | 12.16% |
| Device G | Nanostructure | 10.2 | 8.1 | 9.68% | 9.46% |
| Device H | Nanostructure + Light-extracting layer | 11.6 | 9.5 | 24.73% | 28.38% |

TABLE 3

(Yellow emitting)

| Device | Device configuration | LE (cd/A) | PE (lm/W) | LE increase | PE increase |
|---|---|---|---|---|---|
| Control Device 5 | Control | 45 | 48 | — | — |
| Control Device 6 | Control + Light-extracting layer | 10.2 | 8.1 | 2.22% | 4.17% |
| Device I | Nanostructure | 10.2 | 8.1 | 2.22% | 4.17% |
| Device J | Nanostructure + Light-extracting layer | 49 | 53 | 8.89% | 10.42% |

TABLE 4

Blue Emitting

| Device | Device configuration | LE (cd/A) | PE (lm/W) | LE increase | PE increase |
|---|---|---|---|---|---|
| Control Device 7 | Control | 5.7 | 4.9 | — | — |
| Control Device 8 | Control + Light-extracting layer | 7.2 | 6.4 | 26.32 | 30.61 |

TABLE 4-continued

| | | Blue Emitting | | | |
|---|---|---|---|---|---|
| Device | Device configuration | LE (cd/A) | PE (lm/W) | LE increase | PE increase |
| Device K | Nanostructure | 5.9 | 5.1 | 3.51% | 4.08% |
| Device L | Nanostructure + Light-extracting layer | 7.2 | 6.5 | 26.32% | 32.65% |

EXAMPLE 6

As shown generally in FIG. 7C, Devices M-P and Control Devices 9-14 were constructed in a similar manner to Devices G-L and Control Devices 3-8 above, except that Compound IOC-2 was used instead of Compound IOC-1 as the plurality of nanostructures. The results are depicted in Tables 5-8 below:

TABLE 5

| Device | Device configuration | LE (cd/A) | PE (lm/W) | LE increase | PE increase |
|---|---|---|---|---|---|
| | | (Red emitting) | | | |
| Control Device 9 | Control | 7.5 | 6.3 | — | — |
| Device M | Nanostructure | 8.1 | 6.9 | 8.00% | 9.52% |
| Device N | Nanostructure | 8.0 | 6.8 | 6.67% | 7.94% |
| | | Yellow emitting | | | |
| Control Device 11 | Control | 40.3 | 41.5 | — | — |
| Device O | Nanostructure | 48.6 | 50.9 | 20.60% | 22.65% |
| Device P | Nanostructure | 46.8 | 49.1 | 16.13% | 18.31% |
| | | Blue emitting | | | |
| Control Device 9 | Control | 5.1 | 4.4 | — | — |
| Device M | Nanostructure | 5.4 | 4.5 | 5.88% | 2.28% |
| Device N | Nanostructure | 5.5 | 4.6 | 7.84% | 4.54% |

EXAMPLE 7

Figure 7B:
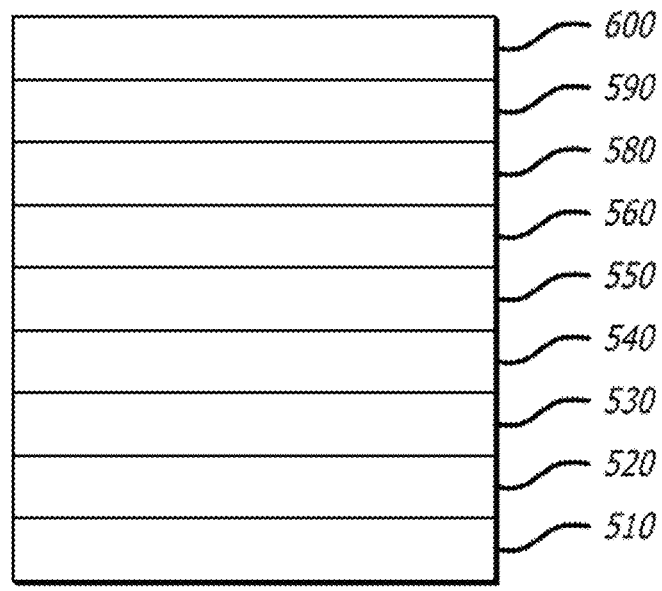

FIG. 7B depicts the structure of Device M that was prepared as follows: SiN covered glass substrates were cleaned by ultrasound in detergent, deionized water, acetone, and 2-propanol consecutively, then baked at about 110° C. for about 3 hours, followed by treatment with oxygen plasma for about 30 min. In a glove-box hosted vacuum deposition system at a pressure of about $10^{-7}$ torr, hole-injecting layer 530 of $MoO_3$ was first deposited on top of anode 520, which was disposed on substrate 510 at deposition rate of 0.05 nm/s, yielding a 10 nm thick film, a hole-transport layer of 540 NPB was then deposited on top of hole-injecting layer 530 layer at deposition rate of 0.1 nm/s, yielding a 40 nm thick film. A 20 nm-thick light-emitting layer 550 of Host-2 doped with a 10 wt % red phosphorescent emitter $Ir(piq)_2acac$ was deposited on top of hole-transport layer 540. Afterwards a 0.4 nm-thick deposit of a plurality of nanostructures 560 (measured by the Quartz sensor) of IOC-2 was deposited at deposition rate around 0.1 Å/s. Then a 40 nm-thick electron-transport layer 580 of TPBi was deposited at 0.1 nm/s and a 1 nm-thick electron injection layer 590 of LiF was deposited on top of TPBi at 0.015 nm/s. The device was completed by cathode 600, which comprised Mg:Ag (20 nm with ratio 1:3) mixed layer co-deposited at deposition rates of 0.1 nm/s and 0.3 nm/s, respectively. Two additional embodiments were constructed as described above, except that 0.4 nm thick deposit of a plurality of nanostructures 560 (measured by the Quartz sensor) of IOC-2 were deposited at deposition rates of about around 0.3 Å/s and 0.5 Å/s.

The reference device was prepared in the same except the 0.4 nm thick IOC-1 layer was omitted. The results are summarized in Table 5 below.

TABLE 5

| Device | LE (cd/A) | PE (lm/W) | EQE (%) | LE increase | PE increase | EQE increase |
|---|---|---|---|---|---|---|
| Control Device | 5.2 | 3.3 | 4.4 | — | — | |
| device with 0.1 A/s deposition rate | 7.9 | 5.3 | 6.6 | 51.9% | 60.6% | 50.0% |
| 0.3 A/sec | 8.0 | 5.3 | 6.6 | 53.9% | 60.6% | 50.0% |
| 0.5 A/sec | 6.5 | 4.1 | 5.5 | 25.0% | 24.2% | 25.0% |

EXAMPLE 8

Red TE-OLEDs having a structure shown in FIG. 7B are prepared. The emission wavelength is 630 nm. In three different devices, the deposition rate of the 0.4 nm thick IOC-2 layer is 0.01 nm/s, 0.03 nm/s and 0.05 nm/s, respectively. It is anticipated that when this device is tested in the same manner as described above, the power efficiency and luminescent efficiency of this device will exhibit the same benefits described above.

EXAMPLE 9

Figure 11:
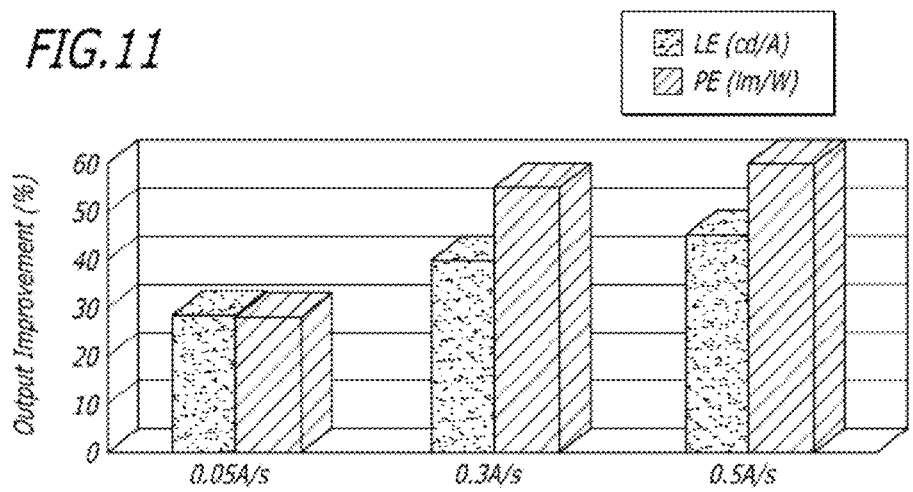
FIG. 11 is a graph that depicts the increase in luminous efficiency and power efficiency of some examples of devices described herein as the rate of deposition was increased.

Device D, Device E, and Device F were prepared in the same manner as Device A, except the plurality of nanostructures were deposited at a rate of 0.05 nm/s for Device D, 0.3 nm/s for Device E, and 0.5 nm/s for Device F. FIG. 11 is a graph that depicts the increase in luminous efficiency and power efficiency as the rate of deposition was increased.

Unless otherwise indicated, all numbers expressing quantities of ingredients, properties such as molecular weight, reaction conditions, and so forth used in the specification and claims are to be understood as being modified in all instances by the term "about." Accordingly, unless indicated to the contrary, the numerical parameters set forth in the specification and attached claims are approximations that may vary depending upon the desired properties sought to be obtained. At the very least, and not as an attempt to limit the application of the doctrine of equivalents to the scope of the claims, each numerical parameter should at least be construed in light of the number of reported significant digits and by applying ordinary rounding techniques.

The terms "a," "an," "the" and similar referents used in the context of describing the invention (especially in the context of the following claims) are to be construed to cover both the singular and the plural, unless otherwise indicated herein or clearly contradicted by context. All methods described herein can be performed in any suitable order unless otherwise indicated herein or otherwise clearly contradicted by context. The use of any and all examples, or exemplary language (e.g., "such as") provided herein is intended merely to better illuminate the invention and does not pose a limitation on the scope of any claim. No language in the specification should be construed as indicating any non-claimed element essential to the practice of the invention.

Groupings of alternative elements or embodiments disclosed herein are not to be construed as limitations. Each group member may be referred to and claimed individually or in any combination with other members of the group or other elements found herein. It is anticipated that one or more members of a group may be included in, or deleted from, a group for reasons of convenience and/or patentability. When any such inclusion or deletion occurs, the specification is deemed to contain the group as modified thus fulfilling the written description of all Markush groups used in the appended claims.

Certain embodiments are described herein, including the best mode known to the inventors for carrying out the invention. Of course, variations on these described embodiments will become apparent to those of ordinary skill in the art upon reading the foregoing description. The inventor expects skilled artisans to employ such variations as appropriate, and the inventors intend for the invention to be practiced otherwise than specifically described herein. Accordingly, the claims include all modifications and equivalents of the subject matter recited in the claims as permitted by applicable law. Moreover, any combination of the above-described elements in all possible variations thereof is contemplated unless otherwise indicated herein or otherwise clearly contradicted by context.

In closing, it is to be understood that the embodiments disclosed herein are illustrative of the principles of the claims. Other modifications that may be employed are within the scope of the claims. Thus, by way of example, but not of limitation, alternative embodiments may be utilized in accordance with the teachings herein. Accordingly, the claims are not limited to embodiments precisely as shown and described.

What is claimed is:

1. A light-emitting device comprising:
    a light-emitting layer disposed between an anode and a cathode;
    a first charge-transport layer comprising a first charge-transport material, and disposed between the light-emitting layer and the anode or the cathode;
    a nanostructure material disposed between, or in contact with, the first charge-transport layer and the light-emitting layer;
    wherein the nanostructure material comprises an organic compound; and
    wherein the organic compound comprises an optionally substituted aromatic or heteroaromatic ring or ring system.

2. The light-emitting device of claim 1, wherein light emitted from the device passes through the first charge-transport layer.

3. The light-emitting device of claim 1, wherein the first charge-transport layer is an electron-transport layer disposed between the light-emitting layer and the cathode.

4. The light-emitting device of claim 2, further comprising a hole-transport layer disposed between the light-emitting layer and the anode.

5. The light-emitting device of claim 1, wherein the first charge-transport layer is a hole-transport layer disposed between the light-emitting layer and the anode.

6. The light-emitting device of claim 5, further comprising an electron-transport layer disposed between the light-emitting layer and the cathode.

7. The light-emitting device of claim 1, wherein the nanostructure material is in the form of nanostructures that substantially penetrate or deform a layer that the nanostructure contacts.

8. The light-emitting device of claim 1, wherein at least a portion of the nanostructure material comprises a plurality of nanostructures disposed on a surface of the light-emitting layer nearest the first charge-transport layer.

9. The light-emitting device of claim 1, wherein at least a portion of the nanostructure material is in a transitional layer comprising a mixture of the first charge-transport material and the nanostructure material, and disposed between the light-emitting layer and the first charge-transport layer.

10. The light-emitting device of claim 1, wherein the organic compound has a stable planar conformation.

11. The light-emitting device of claim 1, wherein the organic compound is:

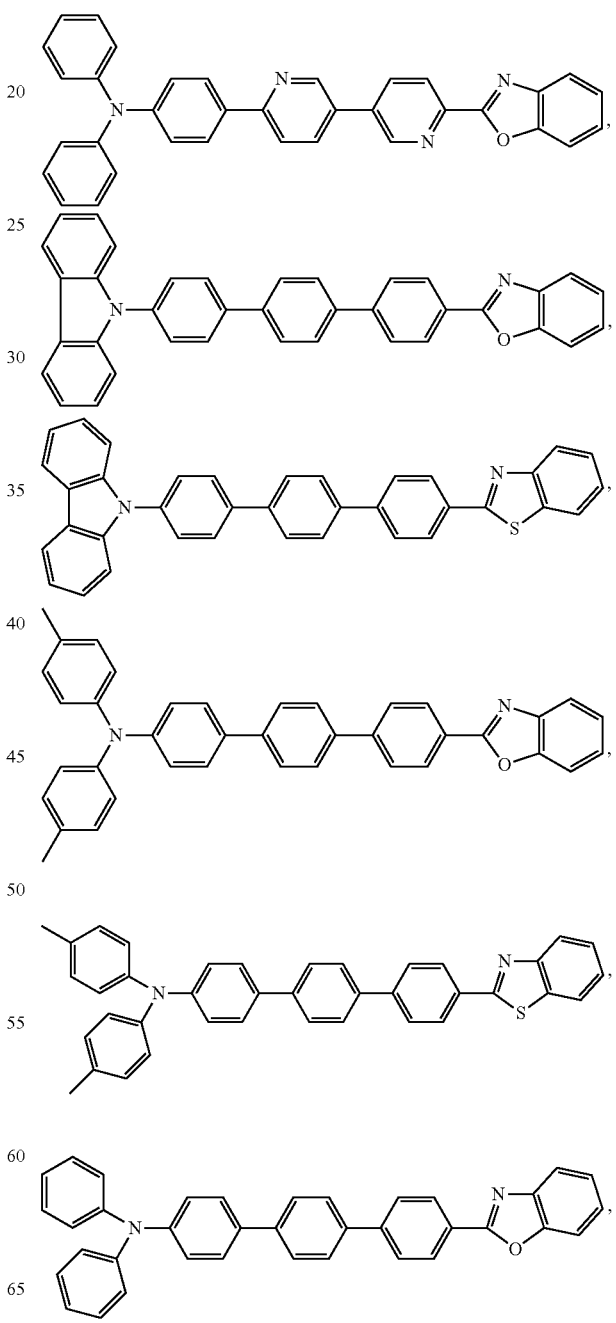

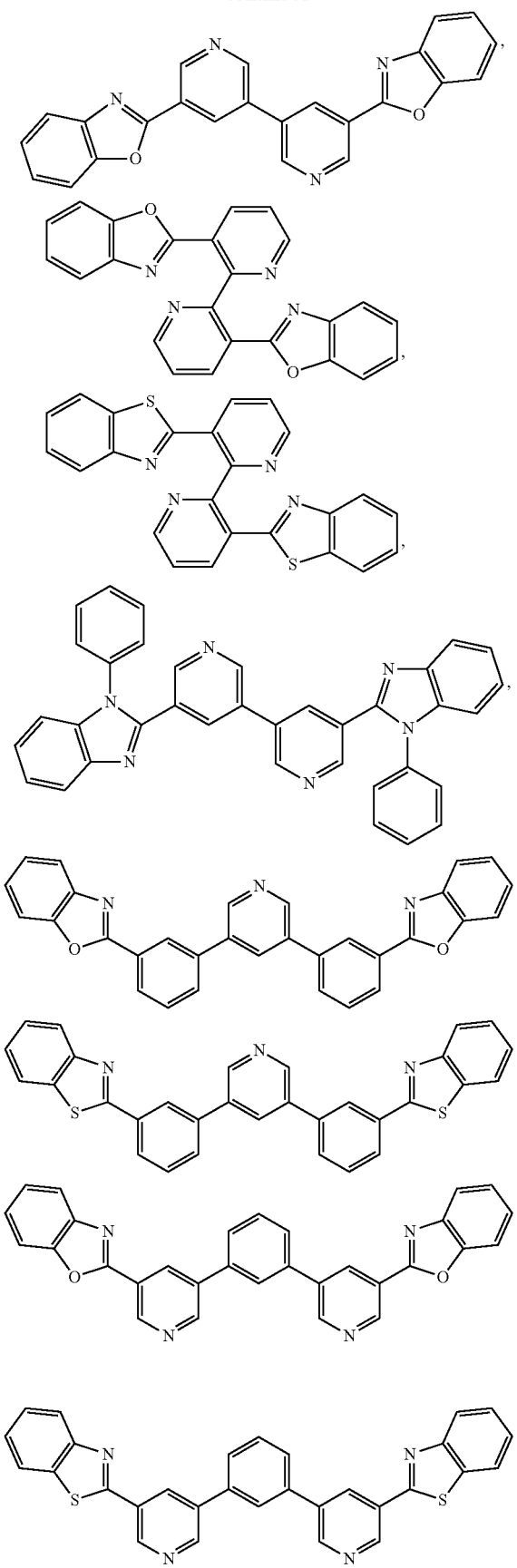
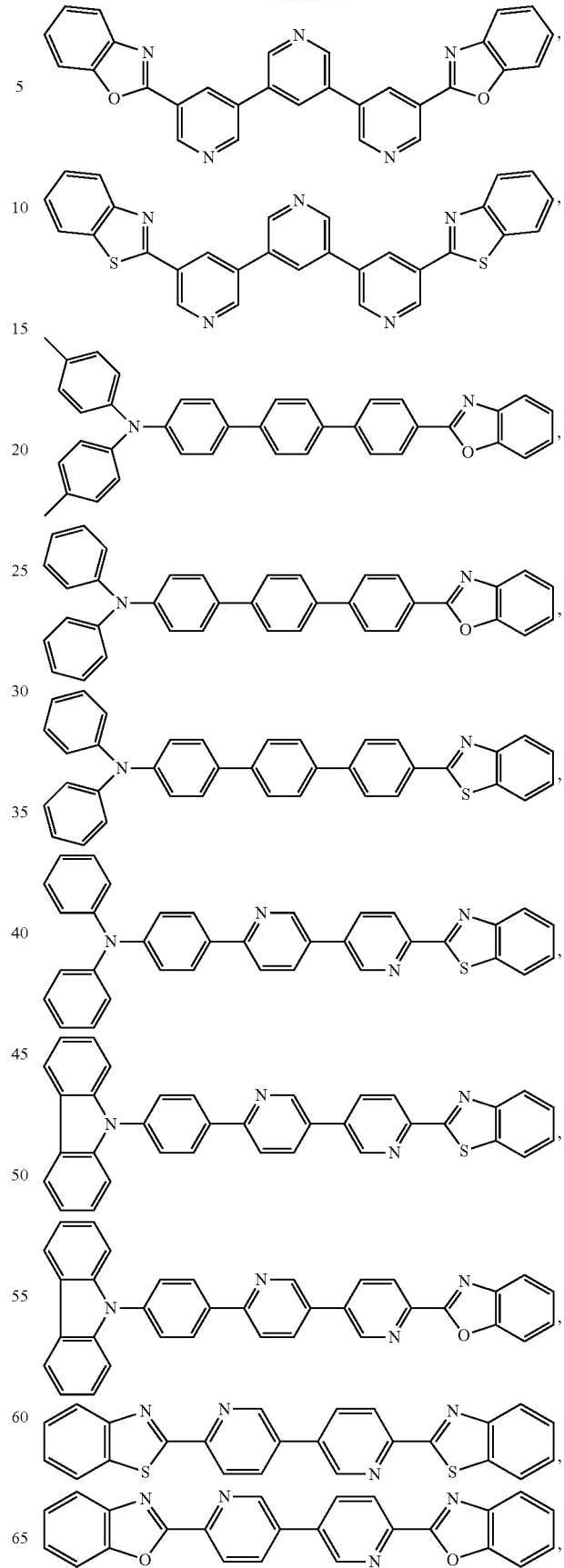

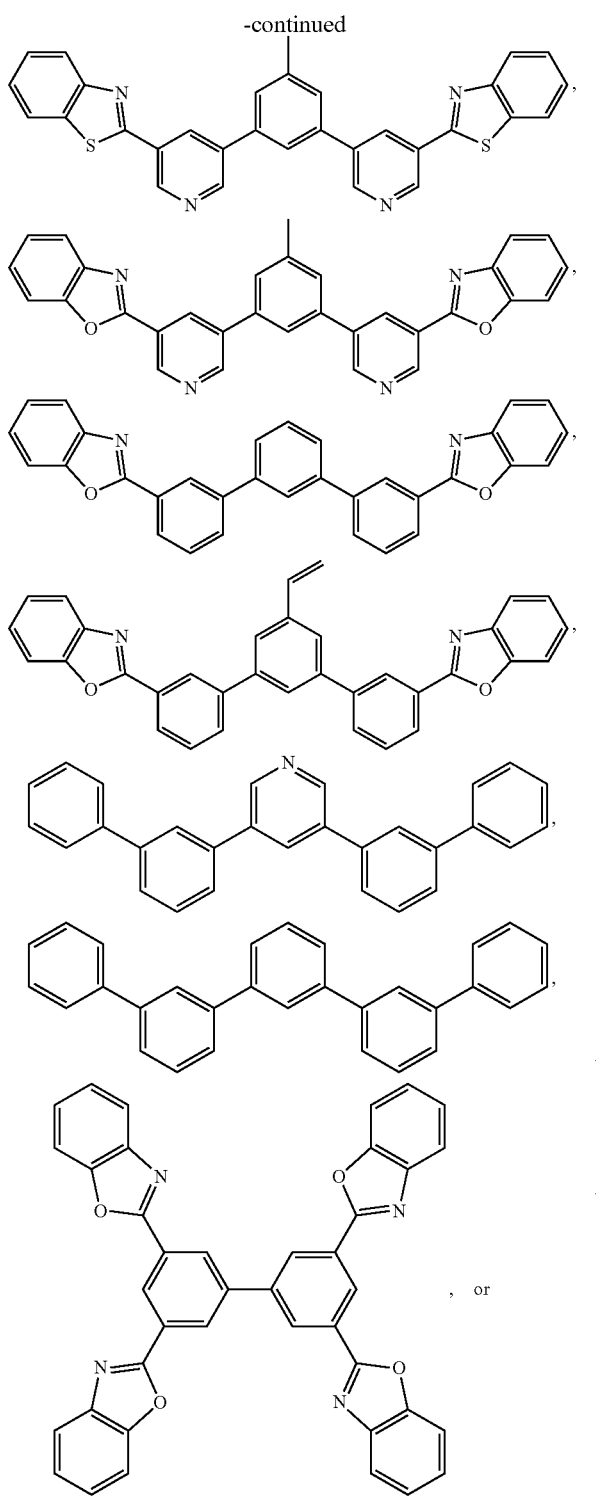

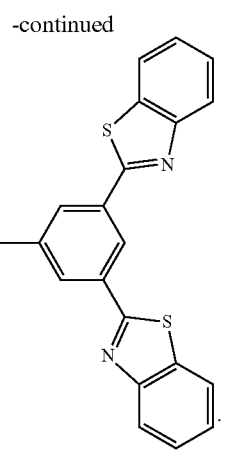

12. The light-emitting device of claim 1, further comprising a light-extracting material.

13. The light-emitting device of claim 1, wherein the nanostructure material has a total mass of about 1 ng to about 500 ng for each $cm^2$ of area of the surface of the light-emitting layer.

14. The light-emitting device of claim 13, wherein the nanostructure material has a total mass of about 10 ng to about 100 ng for each $cm^2$ of area of the surface of the light-emitting layer.

15. The light-emitting device of claim 9, wherein the transitional layer has a weight ratio of nanostructure material to charge-transport material of about 1:1 to about 1:10.

16. The light-emitting device of claim 1, wherein the nanostructure material increases the device's luminous efficiency by at least about 5% as compared to a device that is identical except that it lacks the nanostructure material.

17. The light-emitting device of claim 1, further comprising a light-extracting material disposed on: the anode, the cathode, a transparent layer disposed between the anode and the light-extracting layer, or a transparent layer disposed between the cathode and the light-extracting layer.

18. The light-emitting device of claim 17, wherein the light-extracting material increases the device's power efficiency by at least about 10% as compared to a device that is identical except that it lacks the light-extracting material.

19. The light-emitting device of claim 17, wherein the combination of the nanostructure material and the light-extracting material synergistically increases the device's luminous efficiency.

20. The light-emitting device of claim 19, wherein the combination of the nanostructure material and the light-extracting material synergistically increases the device's luminous efficiency by at least about 15%.

* * * * *